(12) United States Patent
Nonaka

(10) Patent No.: US 12,707,558 B2
(45) Date of Patent: Aug. 11, 2026

(54) CIRCUIT BOARD ASSEMBLY WITH BONDED CONDUCTIVE POSTS AND METHOD OF MANUFACTURING CIRCUIT BOARD ASSEMBLY

(71) Applicant: FUJI ELECTRIC CO., LTD., Kawasaki (JP)

(72) Inventor: Tomomi Nonaka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 489 days.

(21) Appl. No.: 18/307,195

(22) Filed: Apr. 26, 2023

(65) Prior Publication Data

US 2023/0269868 A1 Aug. 24, 2023

Related U.S. Application Data

(63) Continuation of application No. PCT/JP2022/009685, filed on Mar. 7, 2022.

(30) Foreign Application Priority Data

May 18, 2021 (JP) ................................ 2021-083871

(51) Int. Cl.
*H05K 1/02* (2006.01)
*H05K 1/14* (2006.01)
(Continued)

(52) U.S. Cl.
CPC ........... *H05K 1/0271* (2013.01); *H05K 1/145* (2013.01); *H05K 3/368* (2013.01);
(Continued)

(58) Field of Classification Search
CPC ...... H05K 1/0271; H05K 1/145; H05K 3/368; H05K 2201/042; H05K 1/144;
(Continued)

(56) References Cited

U.S. PATENT DOCUMENTS

2002/0053723 A1 5/2002 Matsuura
2009/0135573 A1* 5/2009 Sato ...................... H05K 1/144 29/830
(Continued)

FOREIGN PATENT DOCUMENTS

JP 2006-066427 A 3/2006
JP 2010-165764 A 7/2010
(Continued)

OTHER PUBLICATIONS

International Search Report for PCT/JP2022/009685, mailed on May 10, 2022.
(Continued)

*Primary Examiner* — Ratisha Mehta
*Assistant Examiner* — Brad A Knudson
(74) *Attorney, Agent, or Firm* — Rabin & Berdo, P.C.

(57) ABSTRACT

A semiconductor device includes a semiconductor chip with an electrode, an insulated circuit board including an insulating board and a circuit pattern formed thereon. The circuit pattern has the semiconductor chip on a front surface thereof. The semiconductor device further includes a plurality of conductive posts, each having a lower end bonded to at least one of the front surface of the circuit pattern or the electrode of the semiconductor chip, and each extending vertically upward with respect to a front surface of the insulated circuit board, a printed circuit board bonded to an upper end side of each conductive post, a spacer disposed between the printed circuit board and the insulated circuit board such that a front surface of the printed circuit board faces the insulated circuit board, and a pressing member disposed above the spacer having the printed circuit board therebetween.

15 Claims, 24 Drawing Sheets

(51) Int. Cl.

| | |
|---|---|
| ***H05K 3/36*** | (2006.01) |
| ***H10W 42/00*** | (2026.01) |
| ***H10W 70/65*** | (2026.01) |
| ***H10W 90/00*** | (2026.01) |
| *H10W 74/00* | (2026.01) |
| *H10W 74/01* | (2026.01) |

(52) U.S. Cl.

CPC ....... *H10W 42/121* (2026.01); *H10W 70/658* (2026.01); *H10W 90/00* (2026.01); *H10W 90/401* (2026.01); *H10W 90/701* (2026.01); *H05K 2201/042* (2013.01); *H05K 2201/10166* (2013.01); *H05K 2201/10704* (2013.01); *H10W 74/00* (2026.01); *H10W 74/01* (2026.01); *H10W 90/734* (2026.01); *H10W 90/736* (2026.01)

(58) Field of Classification Search

CPC .......... H05K 2201/10166; H05K 2201/10704; H10W 42/121; H10W 70/658; H10W 90/00; H10W 90/401; H10W 90/701; H10W 74/00; H10W 74/01; H10W 90/734; H10W 90/736

See application file for complete search history.

(56) References Cited

U.S. PATENT DOCUMENTS

| | | | | |
|---|---|---|---|---|
| 2010/0091464 | A1* | 4/2010 | Ohnishi | H05K 7/209 29/890.03 |
| 2011/0080714 | A1* | 4/2011 | Tsukada | H01L 23/3735 174/257 |
| 2015/0187689 | A1* | 7/2015 | Nashida | H01L 23/49575 257/774 |
| 2016/0027716 | A1 | 1/2016 | Yamada | |
| 2016/0233146 | A1 | 8/2016 | Nakamura | |
| 2019/0252292 | A1 | 8/2019 | Nagahara | |
| 2022/0271010 | A1 | 8/2022 | Tominaga | |

FOREIGN PATENT DOCUMENTS

| | | | | |
|---|---|---|---|---|
| JP | 2013-191806 | A | 9/2013 | |
| JP | 2014-057004 | A | 3/2014 | |
| JP | 2014-154806 | A | 8/2014 | |
| JP | 2014199955 | A * | 10/2014 | H01L 24/01 |
| JP | 2015-198216 | A | 11/2015 | |
| JP | 2019-140315 | A | 8/2019 | |
| JP | 2020-136293 | A | 8/2020 | |
| WO | 2009/069308 | A1 | 6/2009 | |
| WO | 2015/064231 | A1 | 5/2015 | |
| WO | 2015/151235 | A1 | 10/2015 | |
| WO | 2021019684 | A1 | 2/2021 | |

OTHER PUBLICATIONS

Written Opinion for PCT/JP2022/009685, mailed on May 10, 2022.

Partial Supplementary European Search Report dated Mar. 18, 2024, in the counterpart European Patent Application No. 22804312.1.

* cited by examiner 10
40b
41e
41d
41c
41b
41a
40a
51
51a
50
50a
23b
25c
25b
24b
23a
24a
25a
21
22
20
60
32
31
33
30
Z
Y
X

CIRCUIT BOARD ASSEMBLY WITH BONDED CONDUCTIVE POSTS AND METHOD OF MANUFACTURING CIRCUIT BOARD ASSEMBLY

CROSS-REFERENCE TO RELATED APPLICATION

This application is a continuation application of International Application PCT/JP2022/009685 filed on Mar. 7, 2022, which designated the U.S., which claims priority to Japanese Patent Application No. 2021-083871, filed on May 18, 2021, the entire contents of which are incorporated herein by reference.

BACKGROUND OF THE INVENTION

1. Field of the Invention

The embodiments discussed herein relate to a semiconductor device and a method of manufacturing a semiconductor device.

2. Background of the Related Art

A semiconductor device is equipped with semiconductor chips including power devices, and is used as a power converter apparatus. The power devices are switching elements. Example switching elements include insulated gate bipolar transistors (IGBTs) and power metal oxide semiconductor field effect transistors (MOSFETs).

This type of semiconductor device includes an insulated circuit board, a semiconductor chip, and a printed circuit board. The insulated circuit board includes an insulating board and a plurality of circuit patterns provided on the insulating board. Semiconductor chips are provided on predetermined circuit patterns. The printed circuit board includes predetermined circuit layers. Conductive posts are press-fitted into and passed through through-holes in the printed circuit board. The conductive posts attached to a printed circuit board are bonded to the circuit patterns on the insulated circuit board and also to the semiconductor chips. The insulated circuit board, the printed circuit board, and the semiconductor chips that have been integrated in this way are set in a mold and resin is injected into the mold interior to encapsulate the components, thereby manufacturing a semiconductor device (as examples, the literatures (1) to (5) below). Alternatively, a printed circuit board may be bonded to external terminals that extend from a semiconductor device in which an insulated circuit board and semiconductor chips have been encapsulated in resin, and a power module, a printed circuit board, and a heat sink may be screwed on (see the literature (6) below for example).

It is also possible to regard the type of semiconductor device described above as a “unit”, to dispose a plurality of these units on a cooler, to provide a wiring board on the front side of the plurality of units, and to bolt the wiring board and the cooler together (see, for example, the literature (7) below). A printed circuit board may also be fixed to a compound resin structure using screws (see, for example, the literature (8) below).

(1): Japanese Laid-open Patent Publication No. 2014-154806

(2): Japanese Laid-open Patent Publication No. 2020-136293

(3): International Publication Pamphlet No. WO 2015/151235

(4): Japanese Laid-open Patent Publication No. 2010-165764

(5): International Publication Pamphlet No. WO 2015/064231

(6): Japanese Laid-open Patent Publication No. 2019-140315

(7): Japanese Laid-open Patent Publication No. 2013-191806

(8): International Publication Pamphlet No. WO 2009/069308

However, in a semiconductor device, when heating is performed to bond the conductive posts attached to a printed circuit board to the circuit patterns of the insulated circuit board and the semiconductor chips with solder, warping of the printed circuit board may occur. As a result, the conductive posts may become separated from the circuit patterns and the semiconductor chips, which prevents mechanical and electrical connections from being made. A semiconductor device manufactured in this way has low reliability and, in some cases, may be defective.

SUMMARY OF THE INVENTION

In one aspect of the embodiments, there is provided a semiconductor device, including: a semiconductor chip including an electrode on a main surface thereof; an insulated circuit board including an insulating board and a circuit pattern formed on a front surface of the insulating board, the circuit pattern having the semiconductor chip on a front surface thereof; a plurality of conductive posts, each conductive post having a lower end and an upper end opposite to each other, the lower end being bonded to at least one of the front surface of the circuit pattern or the electrode of the semiconductor chip, each conductive post extending vertically upward with respect to a front surface of the insulated circuit board; a printed circuit board that is bonded to the plurality of conductive posts at a side of the upper end thereof; a spacer disposed between the printed circuit board and the insulated circuit board such that a front surface of the printed circuit board faces the insulated circuit board; and a pressing member disposed above the spacer with the printed circuit board between the pressing member and the spacer.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
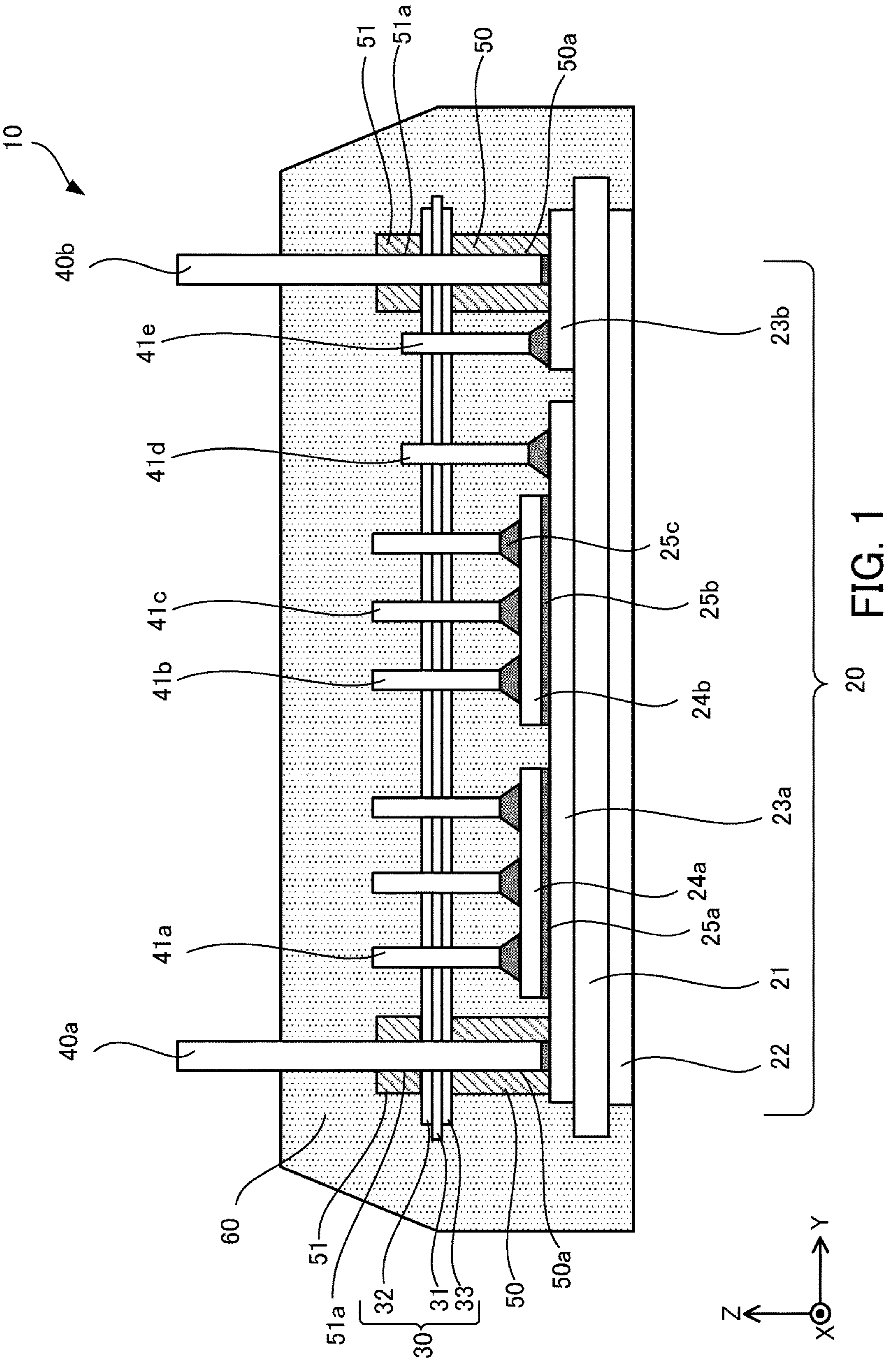
FIG. 1 is a side cross-sectional view of semiconductor device according to a first embodiment.

Several embodiments will be described below with reference to the accompanying drawings. Note that in the following description, the expressions "front surface" and "upper surface" refer to an X-Y plane that faces upward (in the "+Z direction") for a semiconductor device 10 depicted in the drawings. In the same way, the expression "up" refers to the upward direction (or "+Z direction") for the semiconductor device 10 depicted in the drawings. The expressions "rear surface" and "lower surface" refer to an X-Y plane that faces downward (that is, in the "−Z direction") for the semiconductor device 10 depicted in the drawings. In the same way, the expression "down" refers to the downward direction (or "—Z direction") for the semiconductor device 10 depicted in the drawings. These expressions are used as needed to refer to the same directions in the other drawings. The expressions "front surface", "upper surface", "up", "rear surface", "lower surface", "down", and "side surface" are merely convenient expressions used to specify relative positional relationships, and are not intended to limit the technical scope of the present disclosure. As one example, "up" and "down" do not necessarily mean directions that are perpendicular to the ground. That is, the "up" and "down" directions are not limited to the direction of gravity. Additionally, in the following description, the expression "main component" refers to a component that composes 80% or higher by volume out of all the components.

First Embodiment

Figure 2:
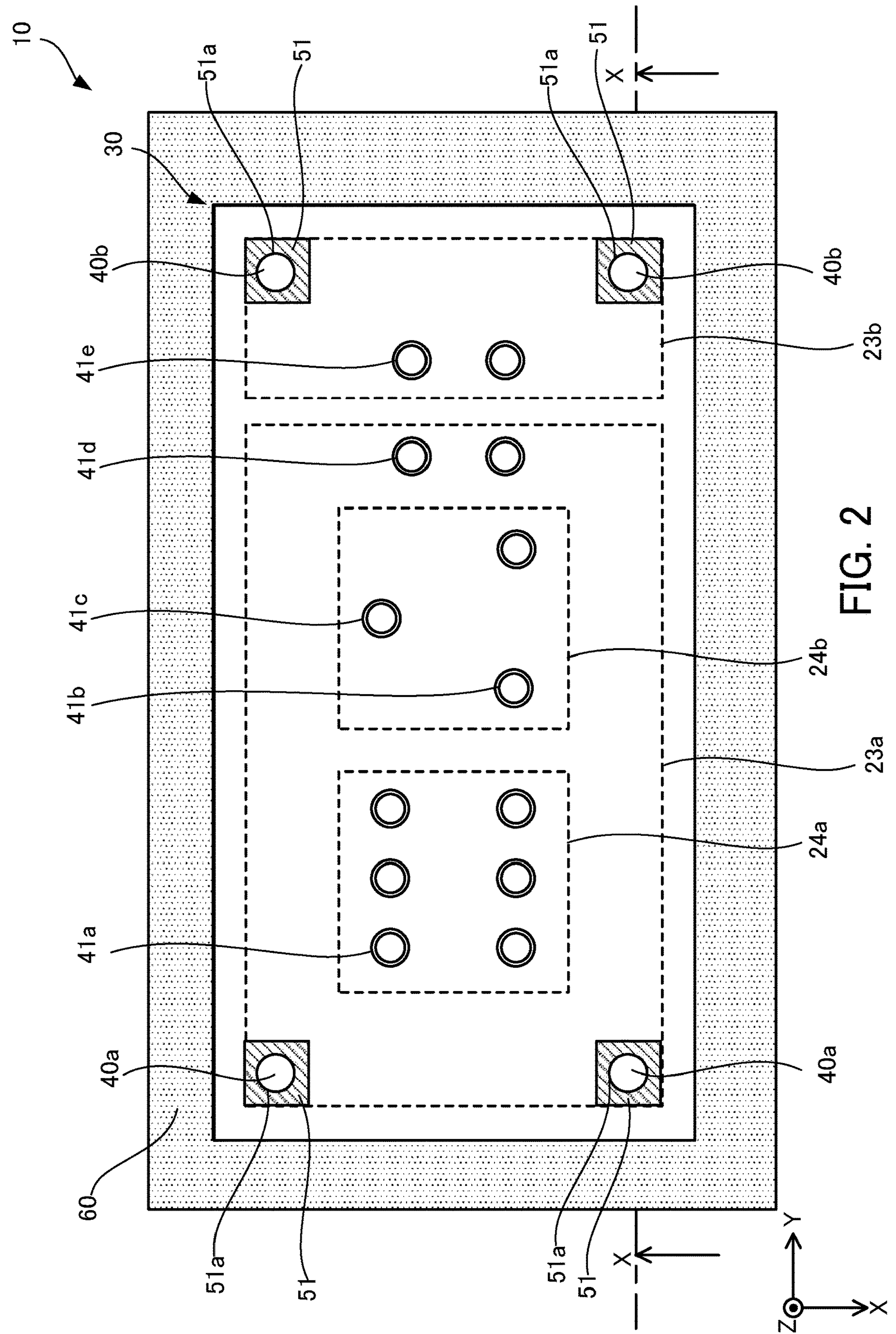
FIG. 2 is a plan view of the semiconductor device according to the first embodiment.

A semiconductor device according to a first embodiment will now be described with reference to FIG. 1 and FIG. 2. FIG. 1 is a side cross-sectional view of a semiconductor device according to the first embodiment and FIG. 2 is a plan view of the semiconductor device according to the first embodiment. Note that FIG. 1 is a cross-sectional view along a dot-dash line X-X in FIG. 2. FIG. 2 is a plan view of a printed circuit board 30 from which an upper part of an encapsulating member 60 has been removed.

As depicted in FIG. 1, the semiconductor device 10 includes an insulated circuit board 20, semiconductor chips 24*a* and 24*b*, the printed circuit board 30, external terminals 40*a* and 40*b*, and conductive posts 41*a* to 41*e*. The semiconductor device 10 further includes spacer portions (spacers) 50 and pressing portions (pressing members) 51. In the semiconductor device 10, these components are encapsulated by the encapsulating member 60. The semiconductor device 10 is encapsulated with the encapsulating member 60 so as to expose a rear surface of the insulated circuit board 20 (that is, a rear surface of a metal plate 22).

The insulated circuit board 20 is rectangular in shape in plan view. Also in plan view, the insulated circuit board 20 has long sides that extend in the Y direction and short sides that extend in the X direction. The insulated circuit board 20 includes an insulating board 21, the metal plate 22 that is provided on a rear surface of the insulating board 21, and circuit patterns 23*a* and 23*b* provided on a front surface of the insulating board 21. The insulating board 21 and the metal plate 22 are rectangular in plan view. Corner portions of the insulating board 21 and the metal plate 22 may be chamfered into rounded or beveled shapes. The size of the metal plate 22 is smaller than the size of the insulating board 21 in plan view, and is formed inside the insulating board 21.

The insulating board 21 is made of a ceramic or insulating resin with favorable thermal conductivity. Example ceramics include aluminum oxide, aluminum nitride, and silicon nitride. Example insulating resins include paper phenol board, paper epoxy board, glass composite board, and glass epoxy board.

The metal plate 22 is made of metal with superior thermal conductivity. Example metals include aluminum, iron, silver, copper, or alloy containing at least one of such metals. The thickness of the metal plate 22 is 0.1 mm or more and 4.0 mm or less. A plating treatment may be performed on the surface of the metal plate 22 to improve corrosion resistance. When doing so, the plating material in use may be nickel, nickel-phosphorus alloy, or nickel-boron alloy, for example.

The circuit patterns 23*a* and 23*b* are made of a metal with superior electrical conductivity. Example metals include silver, copper, nickel, or alloy containing at least one of these metals. The thickness of the circuit patterns 23*a* and 23*b* is 0.1 mm or more and 4.0 mm or less. A plating treatment may be performed on the surfaces of the circuit patterns 23*a* and 23*b* to improve corrosion resistance. When doing so, the plating material in use may be nickel, nickel-phosphorus alloy, or nickel-boron alloy, for example. The circuit patterns

23*a* and 23*b* are formed as described below. As one example, the circuit patterns 23*a* and 23*b* may be obtained by forming a metal layer on the front surface of the insulating board 21 and subjecting this metal layer to a process such as etching. Alternatively, the circuit patterns 23*a* and 23*b* that have been cut out from a metal layer in advance may be crimped onto the front surface of the insulating board 21. Note that the circuit patterns 23*a* and 23*b* depicted in FIG. 1 are mere examples. The number, shapes, sizes, and the like of the circuit patterns may be selected as appropriate.

As examples of the insulated circuit board 20 formed of the components described above, a direct copper bonding (DCB) board, an active metal brazed (AMB) board, or a resin insulating board may be used.

The semiconductor chips 24*a* and 24*b* are power devices made of silicon, silicon carbide, gallium nitride, or gallium oxide as a main component. These power devices are diode elements or switching elements.

The semiconductor chip 24*a* includes a diode element. Example diodes include Schottky barrier diodes (SBDs) and free wheeling diodes (FWDs) such as P-intrinsic-N (PiN) diodes. This type of semiconductor chip 24*a* has an output electrode (or "cathode electrode") as a main electrode on the rear surface and an input electrode (or "anode electrode") as a main electrode on the front surface. The rear surface of the semiconductor chip 24*a* is bonded to the circuit pattern 23*a* by solder 25*a*. The conductive posts 41*a* are also mechanically and electrically connected to main electrodes on the front surface of the semiconductor chip 24*a*.

The semiconductor chip 24*b* includes a switching element. Examples of a switching element include an IGBT and a power MOSFET. When the semiconductor chip 24*b* is an IGBT, the semiconductor chip 24*b* has a collector electrode as a main electrode on the rear surface, and a gate electrode as a control electrode and an emitter electrode as a main electrode on the front surface. When the semiconductor chip 24*b* is a power MOSFET, the semiconductor chip 24*b* has a drain electrode as a main electrode on the rear surface and a gate electrode as a control electrode and a source electrode as a main electrode on the front surface. The rear surface of the semiconductor chip 24*b* described above is bonded to the circuit pattern 23*a* by solder 25*b*. The conductive post 41*b* and the conductive post 41*c* are mechanically and electrically connected to the main electrode and the control electrode, respectively, on the front surface of the semiconductor chip 24*b*.

Note that in place of the semiconductor chips 24*a* and 24*b*, semiconductor chips including reverse-conducting (RC)-IGBT, which have the functions of both an IGBT and an FWD, may be used. Additionally, FIG. 1 merely depicts an example case where the semiconductor chips 24*a* and 24*b* are provided. The present disclosure is not limited to this case, and the number of semiconductor chips may be set according to the specification and the like of the semiconductor device 10.

Lead-free solder is used for the solder 25*a* and 25*b* that bonds the semiconductor chips 24*a* and 24*b* and the circuit pattern 23*a*. As examples, the lead-free solder has at least one of an alloy made of tin-silver-copper, an alloy made of tin-zinc-bismuth, an alloy made of tin-copper, and an alloy made of tin-silver-indium-bismuth as a main component. The solder may further include additives. Example additives include nickel, germanium, cobalt, and silicon. Solder that contains additives has improved wettability, gloss, and bonding strength, which may improve reliability. Sintered metal may be used in place of the solder. As examples, the material of the sintered metal has silver or silver alloy as a main component.

The printed circuit board 30 is provided facing the insulated circuit board 20 which is disposed horizontally. As depicted in FIG. 1, this printed circuit board 30 includes an insulating layer 31 and an upper circuit layer 32 formed on a front surface of the insulating layer 31. In addition, the printed circuit board 30 may have a lower circuit layer 33 on a rear surface of the insulating layer 31. The printed circuit board 30 is formed with the conductive posts 41*a* to 41*e* that pass through from the front surface to the rear surface. The conductive posts 41*a* to 41*e* are electrically connected to the upper circuit layer 32 and the lower circuit layer 33. In addition, the external terminals 40*a* and 40*b* are formed at locations on the printed circuit board 30 that face corner portions of the insulated circuit board 20. The external terminals 40*a* and 40*b* are electrically connected to the upper circuit layer 32 and the lower circuit layer 33.

The insulating layer 31 is flat and made of an insulating material. This material is obtained by immersing a substrate in a resin. As examples, paper, glass cloth, or glass nonwoven fabric is used as the substrate. Also as examples, phenol resin, epoxy resin, or polyimide resin is used as the resin. Specific examples of the insulating layer 31 include a paper phenol substrate, a paper epoxy substrate, a glass epoxy substrate, a glass polyimide substrate, and a glass composite substrate. The insulating layer 31 is also rectangular in plan view. Corner portions of the insulating layer 31 may be chamfered into rounded or beveled shapes.

The upper circuit layer 32 and the lower circuit layer 33 are patterned to form predetermined circuits. Note that the upper circuit layer 32 and the lower circuit layer 33 have been simply illustrated out of convenience as single layers in FIGS. 1 and 2. The upper circuit layer 32 and the lower circuit layer 33 are made of a material with superior electrical conductivity. Example materials are silver, copper, nickel, or an alloy containing at least one of these metals. A plating treatment may be performed on the surfaces of the upper circuit layer 32 and the lower circuit layer 33 to improve corrosion resistance. Materials used in the plating treatment include nickel, nickel-phosphorus alloy, nickel-boron alloy, and the like.

As one example, the printed circuit board 30 may be formed as described below. A metal foil is attached to each of the front and rear surfaces of the insulating layer 31 and resists of a predetermined shape are then printed. The metal foil on the front and rear surfaces of the insulating layer 31 is etched with the printed resists as masks, and any remaining resist is then removed. By doing so, the upper circuit layer 32 and the lower circuit layer 33 are formed on the front and rear surfaces, respectively, of the insulating layer 31. A plurality of through-holes (not illustrated) are then formed by forming holes at predetermined positions in the laminate structure formed of the insulating layer 31, the upper circuit layer 32, and the lower circuit layer 33. A plating treatment may be performed on the plurality of through-holes to improve corrosion resistance. When doing so, as examples, solder plating or electroless gold plating is performed. A water-soluble flux treatment may also be performed.

The external terminals 40*a* and 40*b* are press-fitted into the through-holes in the printed circuit board 30 so as to pass through. When doing so, the press-fitted locations are covered with solder. The external terminals 40*a* and 40*b* are then electrically connected to the upper circuit layer 32 and the lower circuit layer 33 of the printed circuit board 30. Lower end portions of the external terminals 40a and 40b are bonded via the solder 25c to the circuit patterns 23a and 23b of the insulated circuit board 20. Alternatively, the circuit patterns 23a and 23b of the insulated circuit board 20 may be provided with openings at attachment positions of the external terminals 40a and 40b, and the lower end portions of the external terminals 40a and 40b may be bonded via solder 25c to these openings. In addition, tube-shaped contact components may be bonded via solder to the attachment positions of the external terminals 40a and 40b of the circuit patterns 23a and 23b of the insulated circuit board 20 and the lower end portions of the external terminals 40a and 40b may be press-fitted into these contact components. The contact components in this case are made of a material with superior electrical conductivity. Example materials include silver, copper, nickel, or an alloy containing at least one of these metals.

The external terminals 40a and 40b are cylindrical and are formed so as to be circular or rectangular in cross section. The external terminals 40a and 40b are made of a material with superior electrical conductivity. Example materials include silver, copper, nickel, or an alloy containing at least one of these metals. A plating treatment may be performed on the surfaces of the external terminals 40a and 40b to improve corrosion resistance. Example materials used in the plating treatment include nickel, nickel-phosphorus alloy, and nickel-boron alloy. The diameter (in the case of a circular cross section) or the length of a diagonal (in the case of a rectangular cross section) of the external terminals 40a and 40b is several percent longer than the diameter of the through-holes in the printed circuit board 30. This means that the external terminals 40a and 40b are press-fitted into the through-holes in the printed circuit board 30.

The conductive posts 41a to 41e are press-fitted into the through-holes in the printed circuit board 30 so as to pass through. When doing so, the press-fitted locations are covered with solder (not illustrated). The lower end portions of the conductive posts 41a are bonded via the solder 25c to the main electrodes on the front surface of the semiconductor chip 24a. The lower end portions of the conductive posts 41b are bonded via the solder 25c to the main electrodes on the front surface of the semiconductor chip 24b. The lower end portion of the conductive post 41c is bonded via the solder 25c to the control electrode on the front surface of the semiconductor chip 24b. The lower end portions of the conductive posts 41d and 41e are bonded via the solder 25c to the circuit patterns 23a and 23b, respectively, of the insulated circuit board 20. These conductive posts 41a to 41e are column-shaped and are circular or rectangular in cross section. The lengths of the conductive posts 41a to 41e are sufficiently shorter than the lengths of the external terminals 40a and 40b. The conductive posts 41a to 41e are made of a material with superior electrical conductivity. Example materials include silver, copper, nickel, or an alloy containing at least one of these metals. A plating treatment may be performed on the surfaces of the conductive posts 41a to 41e to improve corrosion resistance. Example plating materials include nickel, nickel-phosphorus alloy, and nickel-boron alloy. The diameter (in the case of a circular cross section) or the length of a diagonal (in the case of a rectangular cross section) of the conductive posts 41a to 41e is several percent longer than the diameters of the through-holes in the printed circuit board 30. This means that the conductive posts 41a to 41e are press-fitted into the through-holes in the printed circuit board 30.

Both the spacer portions 50 and the pressing portions 51 are made of a material that is resistant to heat and has a small coefficient of thermal expansion as a main component. Example materials include ceramics, carbon, and composite materials including ceramic and/or carbon.

The spacer portions 50 are disposed at the four corners of the insulated circuit board 20 in plan view, and have the printed circuit board 30 disposed thereon. That is, the rear surfaces of the four corners of the printed circuit board 30 are respectively supported by the spacer portions 50. The spacer portions 50 are formed as polygonal prisms, and have through-holes 50a formed so as to pass through between the upper and lower surfaces of the spacer portions 50. This means that the external terminals 40a and 40b are inserted through the through-holes 50a in the spacer portions 50. The height from the lower surface to the upper surface of the spacer portions 50 corresponds to a desired distance of separation for the printed circuit board 30 from the insulated circuit board 20. So long as this height is maintained, the shape of the spacer portions 50 is not limited to a polygonal prism and may be a circular prism.

So long as the spacer portions 50 maintain this height, the external terminals 40a and 40b do not need to penetrate through the spacer portions 50. By inserting the external terminals 40a and 40b through the spacer portions 50, it is possible to dispose the spacer portions 50 in the limited space available above the insulated circuit board 20. Also, by inserting the external terminals 40a and 40b into the through-holes 50a of the spacer portions 50, it is possible to suppress positional displacements of the printed circuit board 30, which is bonded to the external terminals 40a and 40b, in directions on a plane (the X-Y plane). So long as the height is maintained, the spacer portions 50 do not need to be disposed at the four corners of the insulated circuit board 20. However, disposing the spacer portions 50 at the four corners of the insulated circuit board 20 makes it possible to stably place the printed circuit board 30 on the spacer portions 50. Depending on the design specification and the like of the semiconductor device 10, the spacer portions 50 may be disposed at the four corners of the insulated circuit board 20 even when the external terminals 40a and 40b are not provided at the four corners. In this case, support rods that are similar to the external terminals 40a and 40b may be provided at the four corners of the insulated circuit board 20 and the support rods may be inserted through the through-holes 50a in the spacer portions 50. By doing so, displacement of the spacer portion 50 in directions on a plane (the X-Y plane) may be suppressed.

The pressing portions 51 are disposed on the spacer portions 50 with the printed circuit board 30 disposed in between. By doing so, the printed circuit board 30 may be pressed toward the spacer portions 50. The pressing portions 51 are formed as polygonal prisms and have through-holes 51a formed so as to pass through between the upper and lower surfaces of the pressing portions 51. This means that the external terminals 40a and 40b are inserted through the through-holes 51a in the pressing portions 51. It is sufficient for the height from the lower surface to the upper surface of the pressing portions 51 to be such that the height of the semiconductor device 10 is not exceeded when the pressing portions 51 are disposed on the printed circuit board 30. It is sufficient for the pressing portions 51 to be disposed on the spacer portions 50. For this reason, the shape of the pressing portions 51 is not limited to a polygonal prism, and may be a circular prism. It is also sufficient for the pressing portions 51 to be disposed on the spacer portions 50, and the through-holes 51a are not indispensable. When the external terminals 40a and 40b do not penetrate through the spacer portions the external terminals 40a and 40b do not penetrate through the pressing portions 51 either. By inserting the external terminals 40*a* and 40*b* through the pressing portions 51, displacement of the pressing portion 51 in directions on a plane (the X-Y plane) may be suppressed. This makes it possible for the pressing portions 51 to reliably press the printed circuit board 30 onto the spacer portions 50. It is preferable for the pressing portions 51 to be disposed at least above the spacer portions 50. When space is available above the printed circuit board 30 and it is possible to press the printed circuit board 30 using pressing portions 51 disposed in empty regions, the pressing portions 51 may be disposed as appropriate in such regions on the printed circuit board 30.

The printed circuit board 30 is pressed by the spacer portions 50 and the pressing portions 51 through which the external terminals 40*a* and 40*b* have been inserted. The printed circuit board 30 is prevented from being positionally displaced in directions on a plane (the X-Y plane) and movement in the vertically upward direction (or Z direction) is also restricted. Since the printed circuit board 30 is kept in a substantially horizontal state, the state where the lower end portions of the conductive posts 41*a* to 41*e* are bonded to the front surfaces of the insulated circuit board 20 and to the semiconductor chips 24*a* and 24*b* is maintained. This will be further described later in this specification.

The encapsulating member 60 contains thermosetting resin and a filler. Examples of thermosetting resins include epoxy resin, phenolic resin, and maleimide resin. An inorganic filler is used as the filler. Examples of inorganic fillers include silicon oxide, aluminum oxide, boron nitride, and aluminum nitride. The encapsulating member 60 contains an appropriate amount of a release agent. As examples, a wax-based, silicone-based, or fluorine-based release agent is used. Note that with the semiconductor device 10 that has been encapsulated in the encapsulating member 60, the metal plate 22 of the insulated circuit board 20 is exposed on the rear surface. When doing so, the metal plate 22 may be flush with the rear surface of the encapsulating member 60, or may protrude outward (in the −Z direction) from the rear surface.

A cooling unit (not illustrated) may be attached via a bonding member to the rear surface of the semiconductor device 10 described above. The bonding member used here is solder, brazing material, or sintered metal. Lead-free solder is used as the solder. Lead-free solder has an alloy containing at least two of tin, silver, copper, zinc, antimony, indium, and bismuth for example as a main component. The solder may additionally contain additives. Example additives include nickel, germanium, cobalt, and silicon. Solder that contains additives has improved wettability, gloss, and bonding strength, which may improve reliability. Example brazing materials have at least one of aluminum alloy, titanium alloy, magnesium alloy, zirconium alloy, and silicon alloy as a main component. The insulated circuit board 20 may be bonded by brazing using a bonding member like those described above. As one example, sintered metal has silver and silver alloy as a main component. Alternatively, the bonding member may be a thermal interface material. Thermal interface materials are adhesives including elastomer sheets, room temperature vulcanization (RTV) rubber, gels, phase change materials, and the like. Attaching a cooling unit via a brazing material or a thermal interface material like those described above improves the dissipation of heat by the semiconductor device 10. Note that examples of a cooling unit include a heat sink formed of a plurality of fins and a cooler device that uses water cooling. A heat sink is made of aluminum, iron, silver, or copper, which have superior thermal conductivity, or an alloy containing at least one of these metals. Also to improve corrosion resistance, as one example a material containing nickel as a main component may be formed by a plating treatment on the surface of the heat sink. As specific examples, aside from nickel, nickel-phosphorus alloy or nickel-boron alloy may be used.

Figure 3:
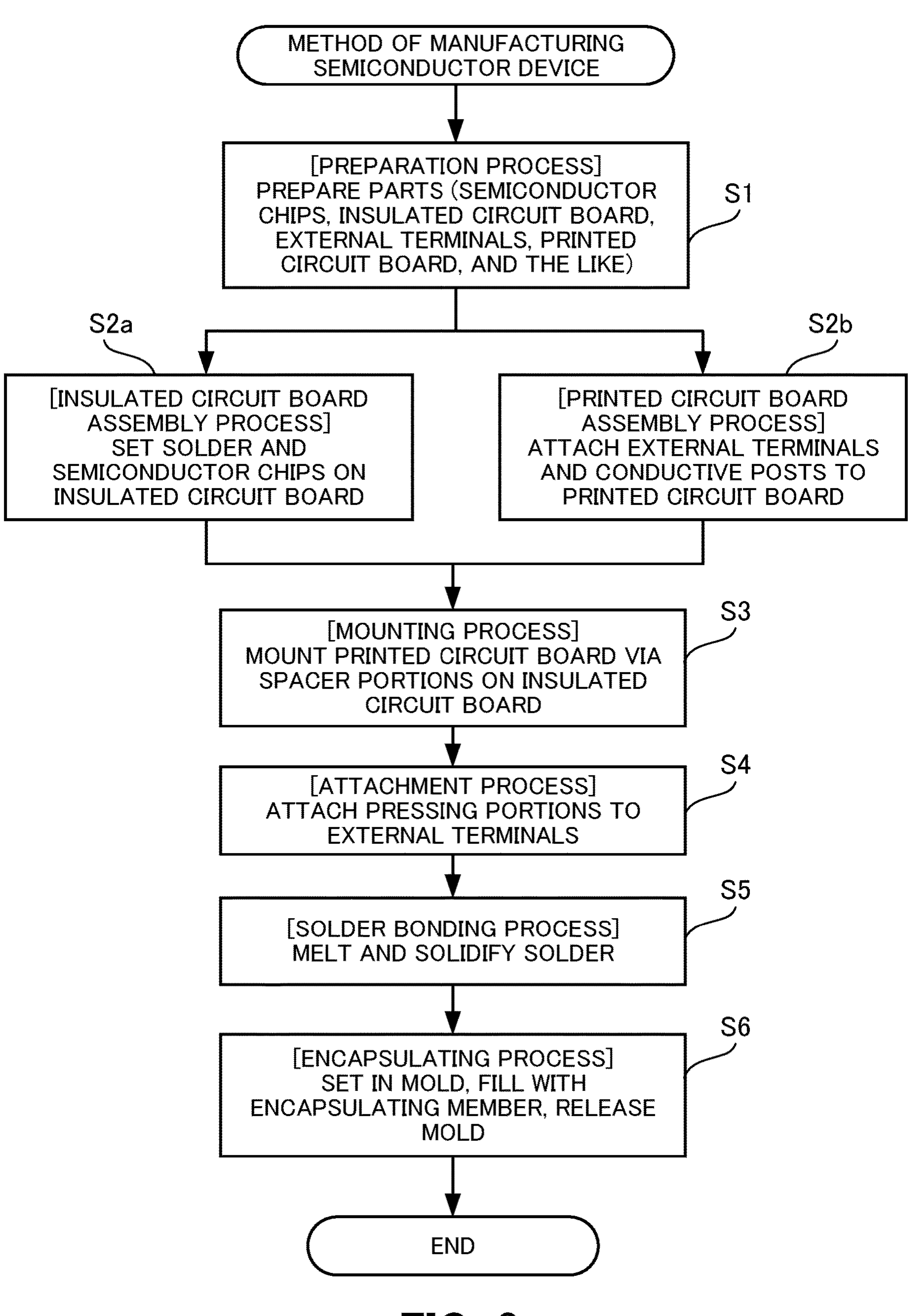
FIG. 3 is a flowchart of a method of manufacturing a semiconductor device according to the first embodiment.
Figure 4:
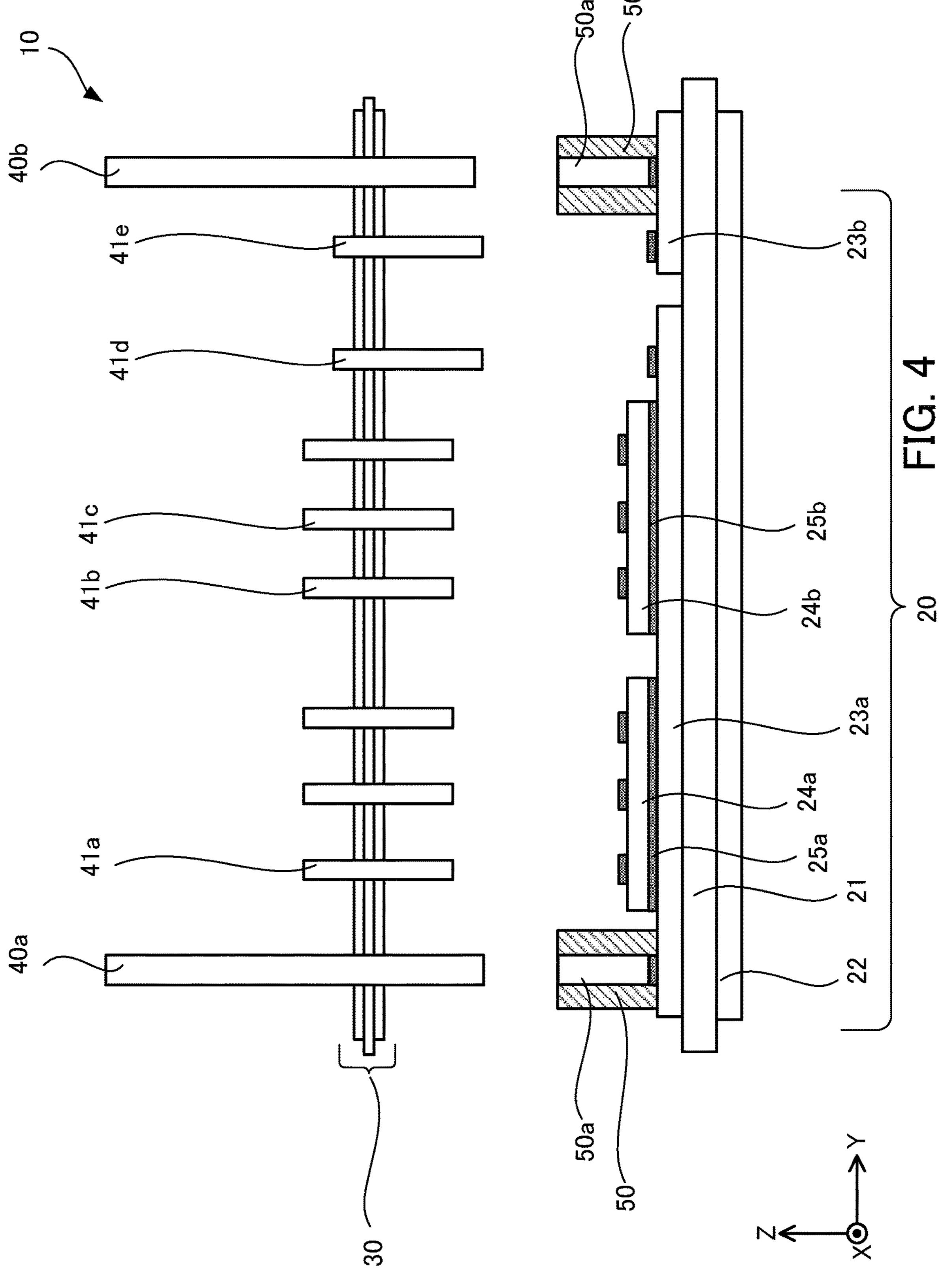
FIG. 4 is a first diagram depicting a mounting process included in the method of manufacturing a semiconductor device according to the first embodiment.
Figure 5:
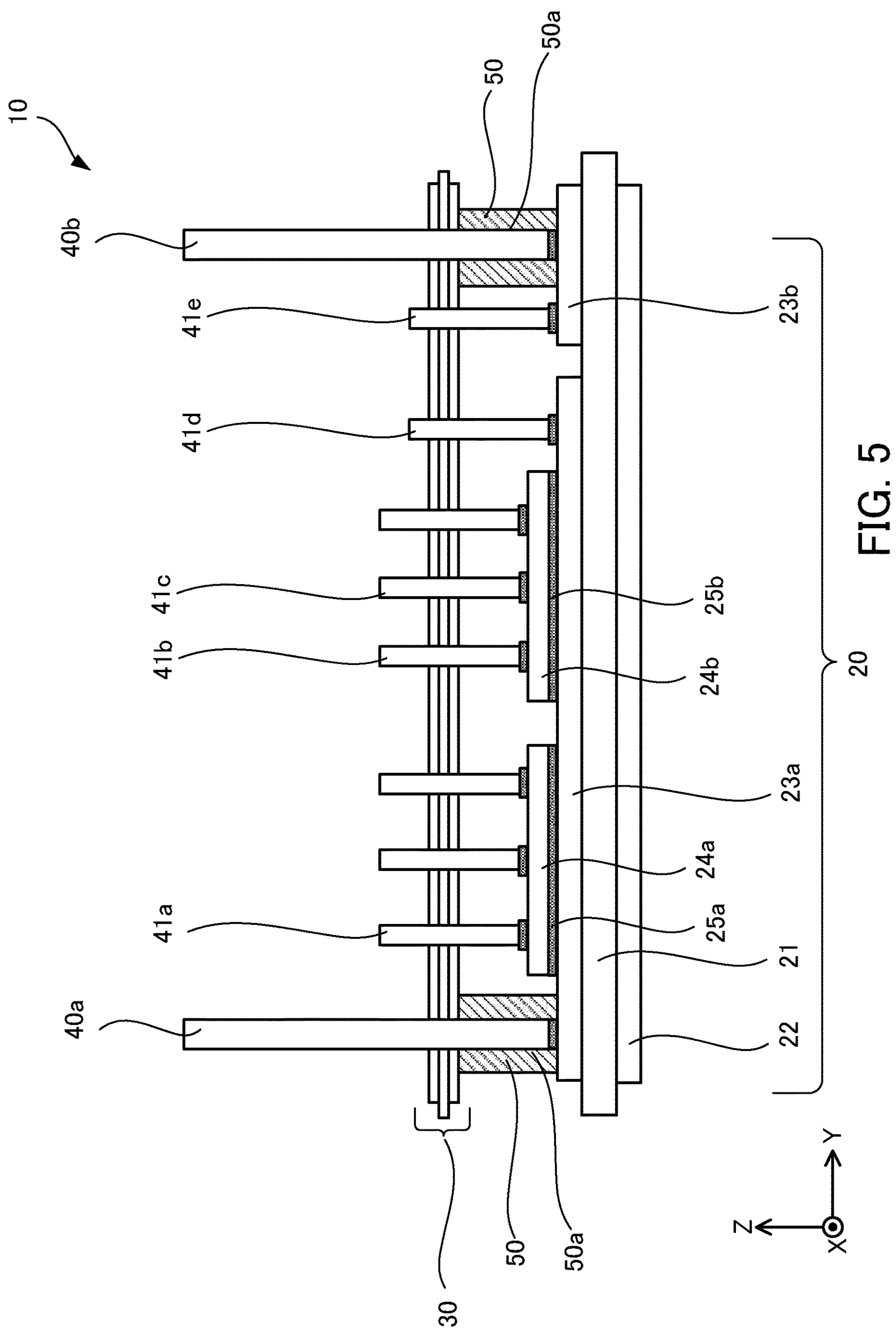
FIG. 5 is a second diagram depicting a mounting process included in the method of manufacturing a semiconductor device according to the first embodiment.
Figure 6:
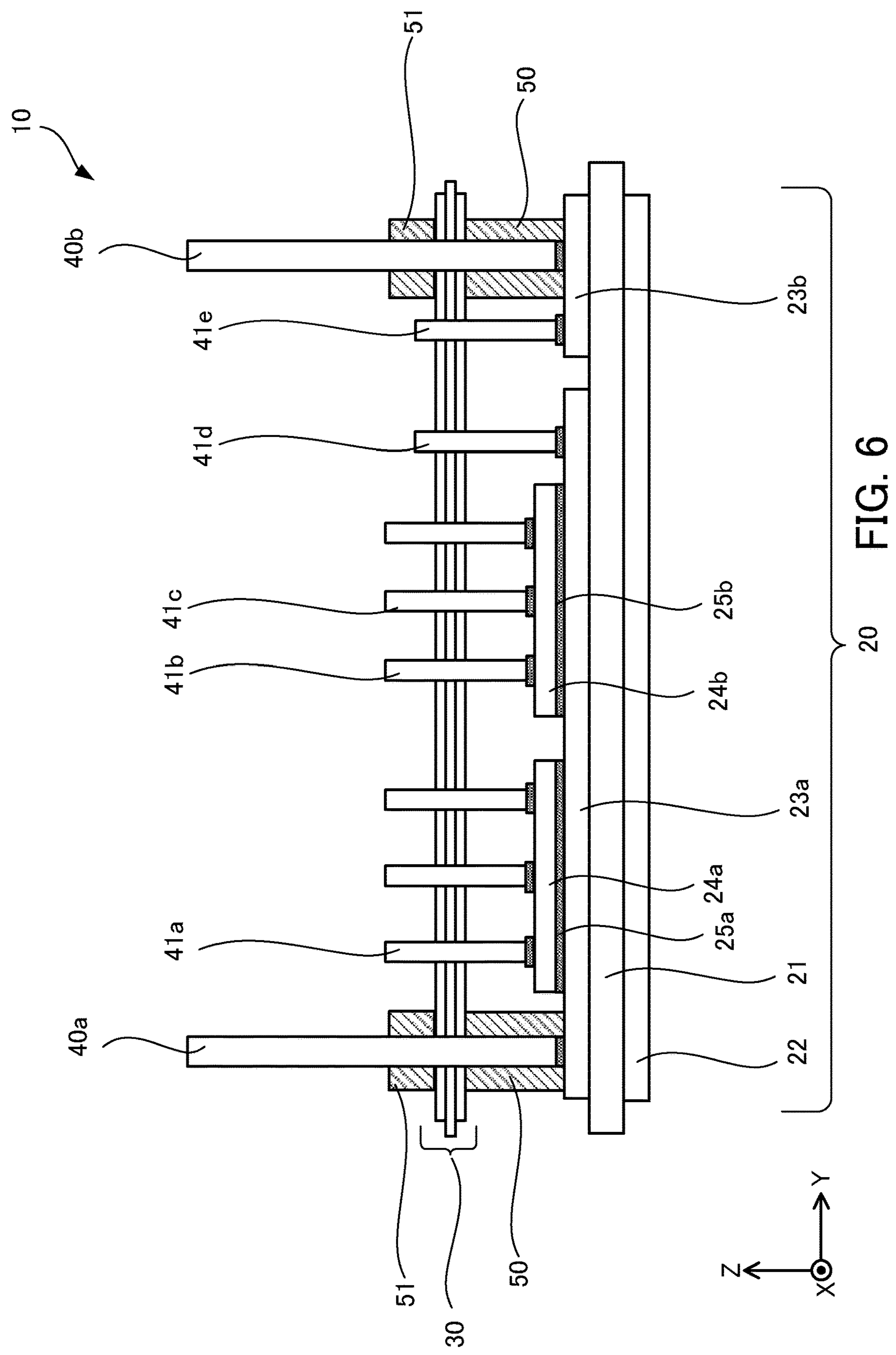
FIG. 6 depicts an attachment process included in the method of manufacturing a semiconductor device according to the first embodiment.

Next, a method of manufacturing the semiconductor device 10 will be described with reference to FIGS. 3 to 6 and FIGS. 1 and 2. FIG. 3 is a flowchart of a method of manufacturing a semiconductor device according to the first embodiment. FIGS. 4 and 5 depict a mounting process included in the method of manufacturing the semiconductor device according to the first embodiment, and FIG. 6 depicts an attachment process included in the method of manufacturing the semiconductor device according to the first embodiment.

First, a preparation process (step S1) is performed to prepare parts that construct the semiconductor device 10. As the parts of the semiconductor device 10, for example, the semiconductor chips 24*a* and 24*b*, the insulated circuit board 20, the external terminals 40*a* and 40*b*, the conductive posts 41*a* to 41*e*, the printed circuit board 30, the spacer portions 50, and the pressing portions 51 are prepared. The above parts are merely typical examples, and other parts aside from these are prepared as appropriate.

Next, an insulated circuit board assembly process (step S2*a*) is performed to set solder, the semiconductor chips 24*a* and 24*b*, and the like on the insulated circuit board 20, and a printed circuit board assembly process (step S2*b*) is performed to attach the external terminals 40*a* and 40*b* and the conductive posts 41*a* to 41*e* to the printed circuit board 30. Note that either of the insulated circuit board assembly process (step S2*a*) and the printed circuit board assembly process (step S2*b*) may be performed first.

In the insulated circuit board assembly process (step S2*a*), the semiconductor chips 24*a* and 24*b* are set via plate solder (not illustrated) in predetermined regions of the circuit pattern 23*a* of the insulated circuit board 20. In the same way, plate solder is set in the regions of the circuit patterns 23*a* and 23*b* of the insulated circuit board 20 where the external terminals 40*a* and 40*b* and the conductive posts 41*a* to 41*e* are to be bonded.

In the printed circuit board assembly process (step S2*b*), the external terminals 40*a* and 40*b* and the conductive posts 41*a* to 41*e* may be inserted through predetermined through-holes in the printed circuit board 30 bonded using solder (see the upper part of FIG. 4).

Next, a mounting process (step S3) is performed to mount the printed circuit board 30 on the insulated circuit board 20 obtained in steps S2*a* and S2*b*. The spacer portions 50 are disposed so that the through-holes 50*a* correspond to the areas of the circuit pattern 23*a* of the insulated circuit board 20 assembled in step S2*a* where the external terminals 40*a* and 40*b* are to be bonded. The printed circuit board 30 assembled in step S2*b* is mounted on the insulated circuit board 20 on which the spacer portions 50 have been disposed. When doing so, the external terminals 40*a* and 40*b* provided on the printed circuit board 30 are aligned with the through-holes 50*a* of the spacer portions 50, as depicted in FIG. 4. In addition, the lower end portions of the conductive posts 41*a* to 41*e* of the printed circuit board 30 are aligned with the semiconductor chips 24*a* and 24*b* and the circuit patterns 23*a* and 23*b* on which the plate solder has been disposed.

After this, as depicted in FIG. 5, the lower end portions of the external terminals 40*a* and 40*b* and the conductive posts 41*a* to 41*e* are placed in contact with the insulated circuit board 20 and the semiconductor chips 24*a* and 24*b*. In particular, the external terminals 40*a* and 40*b* are inserted through the through-holes 50*a* of the spacer portions 50. In addition, the rear surfaces of the four corners of the printed circuit board 30 are supported by the spacer portions 50.

Next, an attachment process (step S4) is performed to attach the pressing portions 51 to the external terminals 40*a* and 40*b* which extend vertically upward (in the +Z direction) from the front surface of the printed circuit board 30. In the state depicted in FIG. 5, the external terminals 40*a* and 40*b* that extend vertically upward (in the +Z direction) from the front surface of the printed circuit board 30 are inserted through the through-holes 51*a* of the pressing portions 51. By doing so, as depicted in FIG. 6, the pressing portions 51 become attached to the spacer portions 50 with the printed circuit board 30 disposed in between. Since this results in the external terminals 40*a* and 40*b* penetrating through the spacer portions 50, movement of the printed circuit board 30 in directions on a plane (the X-Y plane) is restricted. Since the printed circuit board 30 is interposed between the pressing portions 51 and the spacer portions 50, movement in the vertical direction (the +Z direction) of the printed circuit board 30 is restricted.

Next, a solder bonding process (step S5) is performed to add heat to melt the solder and then perform cooling to create solder bonds. In step S4, the insulated circuit board 20 to which the printed circuit board 30 has been attached is heated at a predetermined temperature to melt the plate solder. When doing so, due to the heating, warping of the printed circuit board 30 may occur due to a difference in linear expansion coefficients between the insulating layer 31 and the upper circuit layer 32 and lower circuit layer 33. However, the printed circuit board 30 is pressed toward the spacer portions 50 by the pressing portions 51. By doing so, the warping that has occurred in the printed circuit board 30 is corrected, and the printed circuit board 30 is kept substantially horizontal. In addition, since the printed circuit board 30 is kept horizontal, the lower end portions of the conductive posts 41*a* to 41*e* do not become separated from the insulated circuit board 20 and the semiconductor chips 24*a* and 24*b* and are maintained in a state where the lower end portions of the conductive posts 41*a* to 41*e* contact the insulated circuit board 20 and the semiconductor chips 24*a* and 24*b* as depicted in FIG. 6. By cooling the melted solder, the external terminals 40*a* and 40*b* and the conductive posts 41*a* to 41*e* are reliably bonded mechanically and electrically to the insulated circuit board 20 and the semiconductor chips 24*a* and 24*b*.

Next, an encapsulating process (step S6) is performed to encapsulate the printed circuit board 30, to which the external terminals 40*a* and 40*b* have been attached, and the insulated circuit board 20 and the semiconductor chips 24*a* and 24*b*, to which the conductive posts 41*a* to 41*e* have been bonded, with the encapsulating member. The printed circuit board 30, the insulated circuit board 20, and the semiconductor chips 24*a* and 24*b* that were integrated in step S5 are set in a predetermined mold and the mold is filled with the encapsulating member. When the encapsulating member has solidified, the structure is released from the mold to obtain the semiconductor device 10 depicted in FIGS. 1 and 2.

The semiconductor device 10 described above includes: the semiconductor chips 24*a* and 24*b* that have electrodes on their main surfaces; the insulated circuit board 20 that includes the insulating board 21 and the circuit patterns 23*a* and 23*b* formed on the front surface of the insulating board 21; the conductive posts 41*a* to 41*e* whose lower end portions are bonded to the circuit patterns 23*a* and 23*b* and the front surfaces of the semiconductor chips 24*a* and 24*b* and whose upper end portions extend vertically upward with respect to the circuit patterns 23*a* and 23*b* and the front surfaces of the semiconductor chips 24*a* and 24*b*; and the printed circuit board 30 that is bonded to the upper end portion-sides of the conductive posts 41*a* to 41*e* and disposed facing the insulated circuit board 20. When doing so, the printed circuit board 30 is disposed facing the insulated circuit board 20 with the spacer portions 50 disposed in between on the front surface of the insulated circuit board 20, and the pressing portions 51 are disposed on the spacer portions 50 with the printed circuit board 30 disposed in between. In this semiconductor device 10, the pressing portions 51 are able to correct warping of the printed circuit board 30 that occurs due to heating performed to bond the conductive posts 41*a* to 41*e* to the insulated circuit board 20 and the semiconductor chips 24*a* and 24*b*. Since the printed circuit board 30 is kept substantially horizontal in this way, the lower end portions of the conductive posts 41*a* to 41*e* do not become separated from the insulated circuit board 20 and the semiconductor chips 24*a* and 24*b* and remain mechanically and electrically bonded to the insulated circuit board 20 and the semiconductor chips 24*a* and 24*b*. As a result, the mechanical and electrical connections of the conductive posts 41*a* to 41*e* are maintained and deterioration in the reliability of the semiconductor device 10 is suppressed.

So long as the pressing portions 51 may correct the warping of the printed circuit board 30 in this way, the shape, disposed positions, and number of the pressing portions 51 are not limited to the example depicted in FIGS. 1 and 2. In the following description, modifications to the pressing portions 51 that differ from the configuration depicted in FIGS. 1 and 2 will be described. Note that in the following description, the main difference from the semiconductor device 10 in FIGS. 1 and 2 is the pressing portions 51. For this reason, the description will mainly focus on parts that are different from the semiconductor device 10 in FIGS. 1 and 2. Other parts that do not differ are as described with reference to FIGS. 1 and 2.

Modification 1-1

Figure 7:
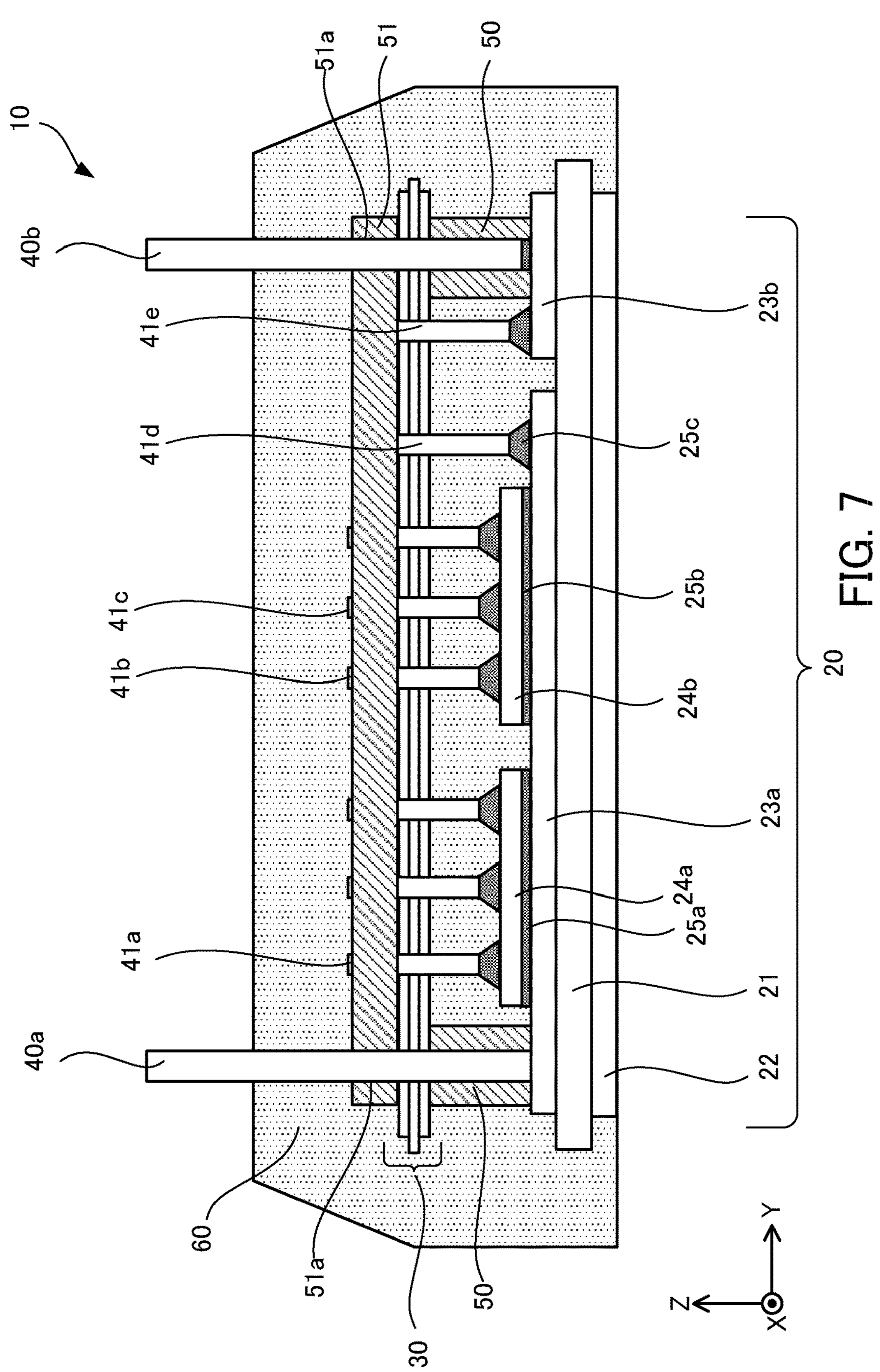
FIG. 7 is a side cross-sectional view of a semiconductor device according to Modification 1-1 of the first embodiment.
Figure 8:
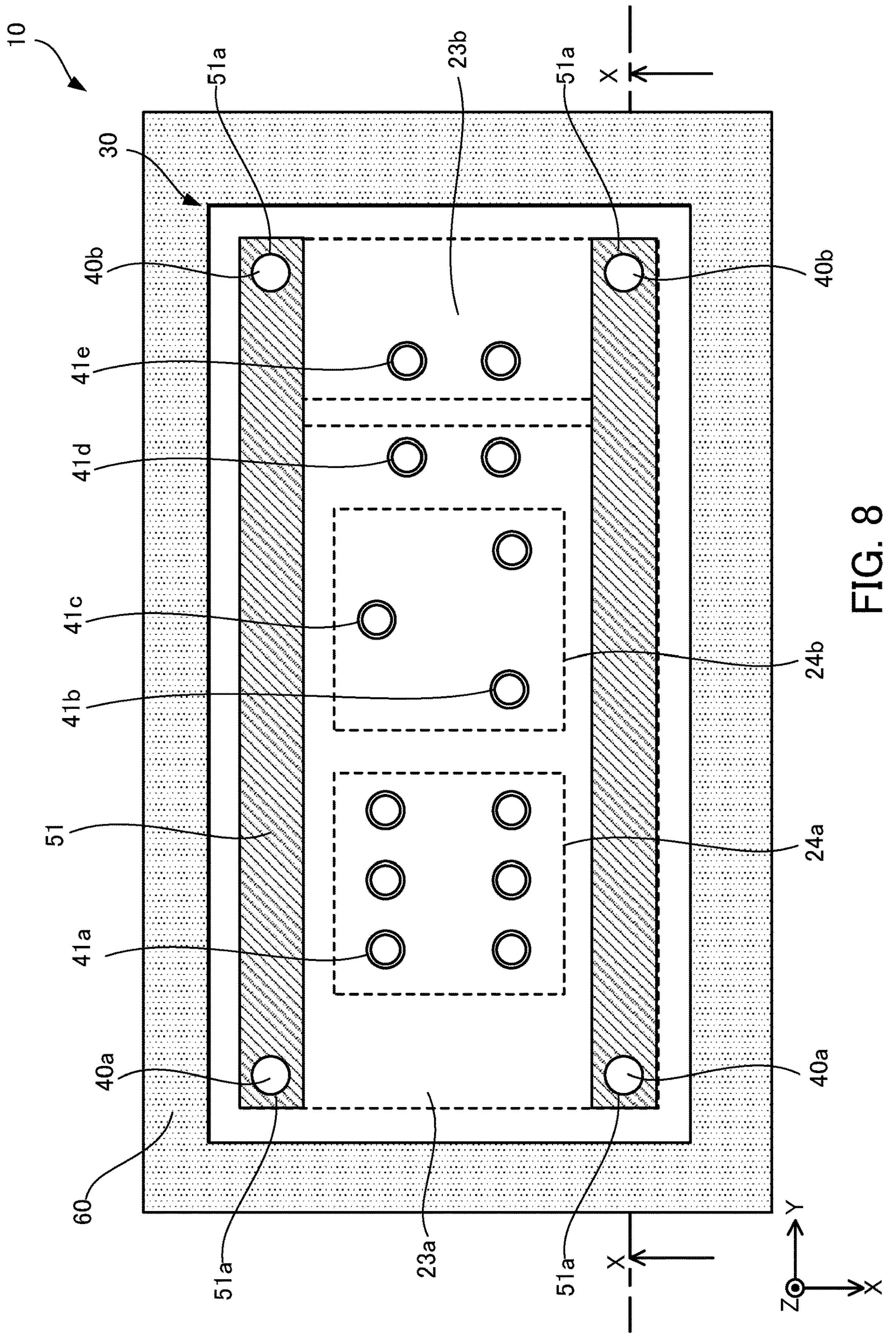
FIG. 8 is a plan view of the semiconductor device according to Modification 1-1 of the first embodiment.

A semiconductor device 10 according to Modification 1-1 will now be described using FIGS. 7 and 8. FIG. 7 is a side cross-sectional view of the semiconductor device according to Modification 1-1 of the first embodiment, and FIG. 8 is a plan view of the semiconductor device according to Modification 1-1 of the first embodiment. Note that FIG. 7 is a cross-sectional view taken along the dot-dash line X-X in FIG. 8. FIG. 8 is a plan view of the printed circuit board 30 with an upper portion of the encapsulating member 60 in FIG. 7 removed.

In the semiconductor device 10 according to Modification 1-1, the pressing portions 51 are I-shaped and have a length corresponding to the long sides of the insulated circuit board 20. The pressing portions 51 are provided along the facing long sides of the insulated circuit board 20, and have the external terminals 40*a* and 40*b* inserted through the through-holes 51*a* provided at both ends. The pressing portions 51 of Modification 1-1 have a wider area for pressing the printed circuit board 30 than the pressing portions 51 in FIGS. 1 and 2. This means that the pressing portions 51 of Modification 1-1 may more reliably correct warping of the printed circuit board 30 than the pressing portions 51 in FIGS. 1 and 2. Accordingly, it is possible to more reliably prevent the separation of the conductive posts 41*a* to 41*e* from the insulated circuit board 20 and the semiconductor chips 24*a* and 24*b*.

On the other hand, it is also preferable for the spacer portions 50 to be disposed below the pressing portion 51 to the greatest degree possible. However, when the insulated circuit board 20 and the printed circuit board 30 are encapsulated with the encapsulating member, the encapsulating member is filled from a side portion of the insulated circuit board 20. For this reason, the spacer portions 50 are shaped and placed so as not to block filling paths taken by the encapsulating member. In view of this, it is preferable that the spacer portions 50 to be disposed at locations facing the four corners of the printed circuit board 30 as depicted in FIGS. 1 and 2 and described in the first embodiment.

Modification 1-2

Figure 9:
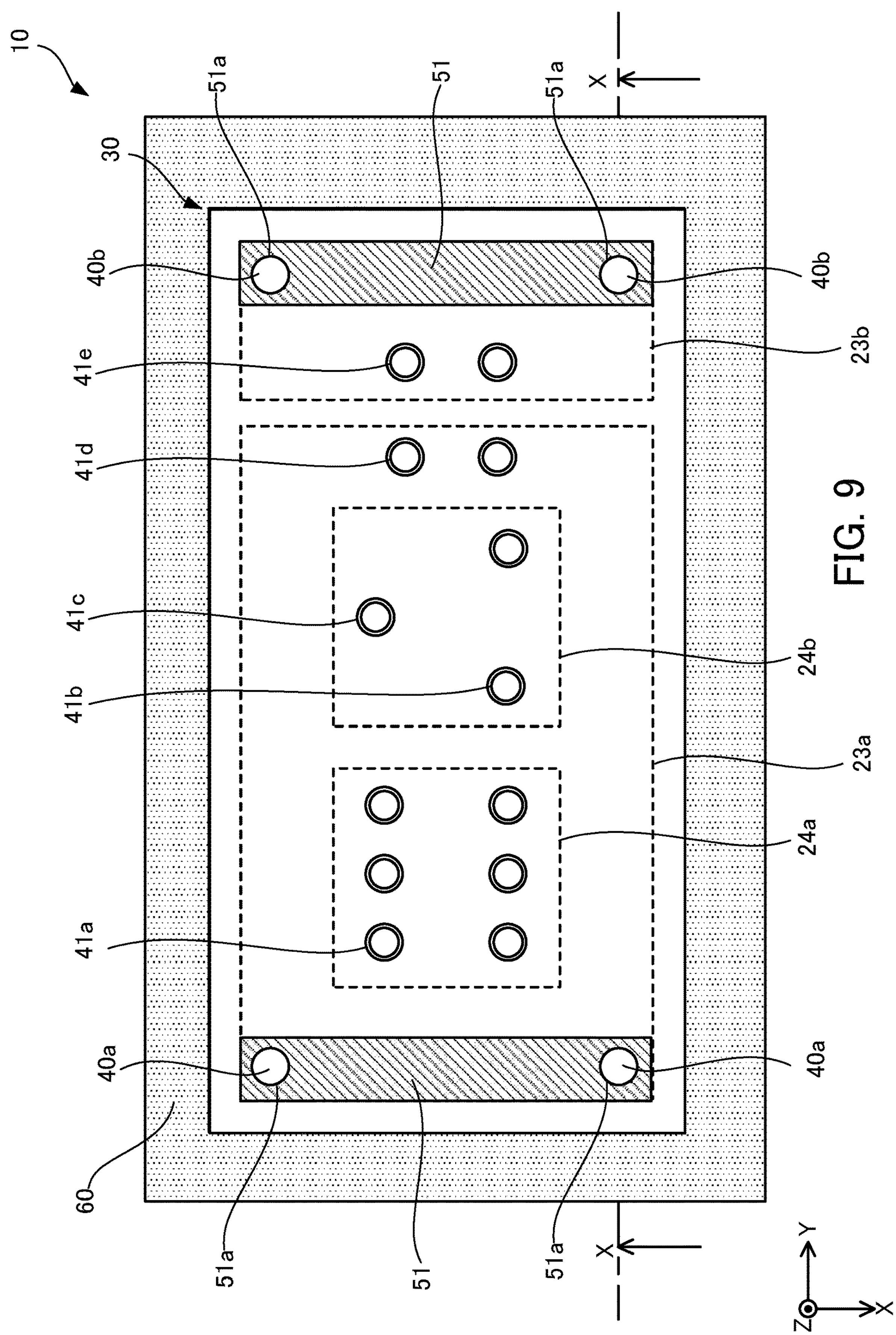
FIG. 9 is a plan view of a semiconductor device according to Modification 1-2 of the first embodiment.

A semiconductor device 10 according to Modification 1-2 will now be described with reference to FIG. 9. FIG. 9 is a plan view of a semiconductor device according to Modification 1-2 of the first embodiment. Note that FIG. 1 may be referred to as a cross-sectional view taken along the dot-dash line X-X in FIG. 9. FIG. 9 is a plan view of the printed circuit board 30 with an upper portion of the encapsulating member 60 removed.

In the semiconductor device 10 according to Modification 1-2, the pressing portions 51 are I-shaped and have a length corresponding to the short sides of the insulated circuit board 20. The pressing portions 51 are provided along the facing short sides of the insulated circuit board 20, and have the external terminals 40*a* and 40*b* inserted through the through-holes 51*a* at both ends. The pressing portions 51 of Modification 1-2 also have a wider area for pressing the printed circuit board 30 than the pressing portions 51 of FIGS. 1 and 2. This means that the pressing portions 51 of Modification 1-2 may more reliably correct warping of the printed circuit board 30 than the pressing portions 51 in FIGS. 1 and 2. Accordingly, it is possible to more reliably prevent separation of the conductive posts 41*a* to 41*e* from the insulated circuit board 20 and the semiconductor chips 24*a* and 24*b*.

Modification 1-3

Figure 10:
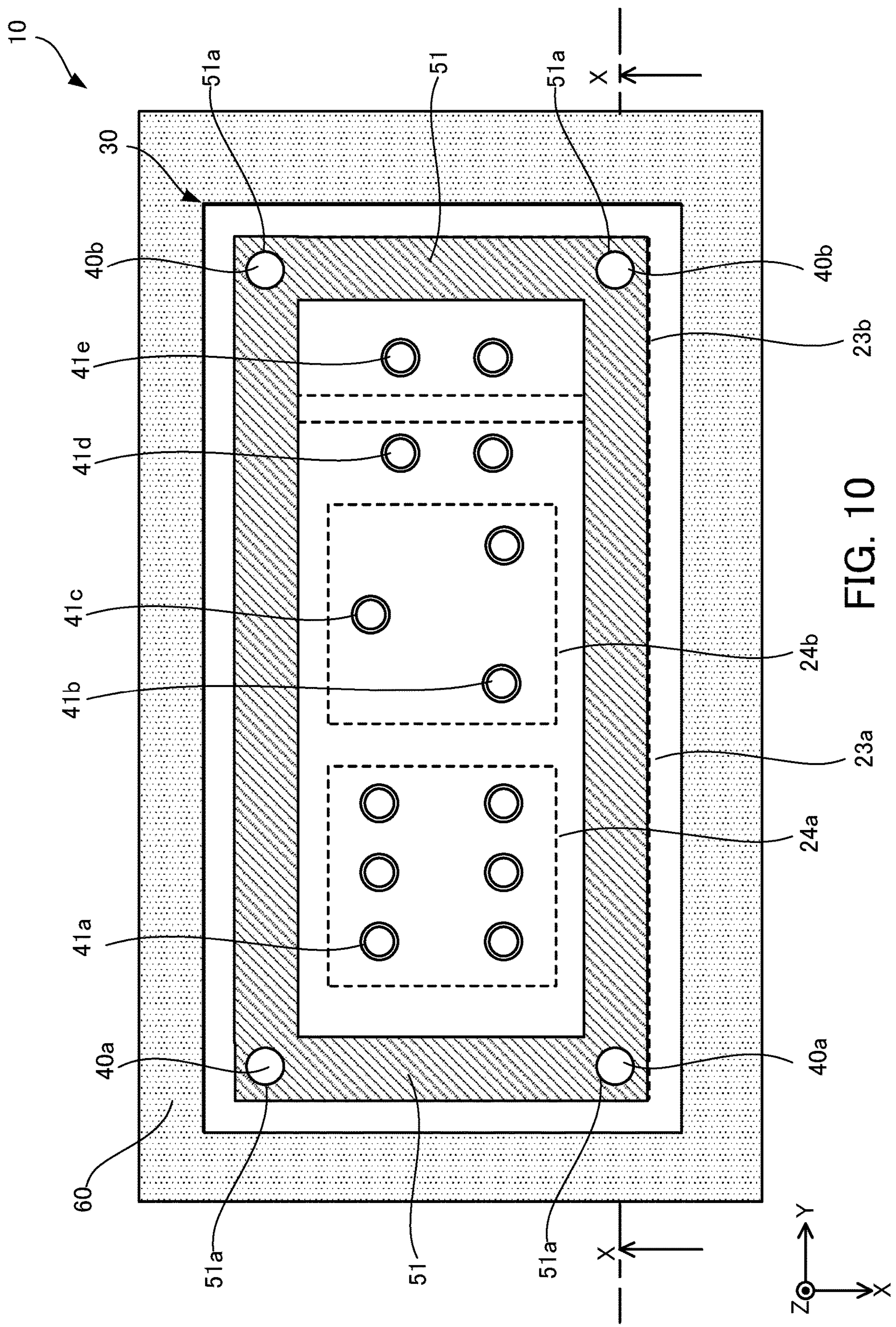
FIG. 10 is a plan view of a semiconductor device according to Modification 1-3 of the first embodiment.

A semiconductor device 10 according to Modification 1-3 will now be described with reference to FIG. 10. FIG. 10 is a plan view of a semiconductor device according to Modification 1-3 of the first embodiment. Note that FIG. 7 may be referred to as a cross-sectional view taken along the dot-dash line X-X in FIG. 10. FIG. 10 is a plan view of the printed circuit board 30 with an upper portion of the encapsulating member 60 removed.

In the semiconductor device 10 according to Modification 1-3, a pressing portion 51 is formed in a shape in plan view and has dimensions continuous ring corresponding to the long sides and short sides of the insulated circuit board 20. The pressing portion 51 is provided along the long and short sides of the insulated circuit board 20 and has the external terminals 40*a* and 40*b* inserted through through-holes 51*a* at the four corners. The pressing portion 51 of Modification 1-3 has a wider area for pressing the printed circuit board 30 than the pressing portions 51 in FIGS. 1 and 2 and in Modifications 1-1 and 1-2. This means that the pressing portion 51 of Modification 1-3 may more reliably correct the warping of the printed circuit board 30. Accordingly, it is possible to more reliably prevent the separation of the conductive posts 41*a* to 41*e* from the insulated circuit board 20 and the semiconductor chips 24*a* and 24*b*.

Note that as described earlier, it is desirable for the pressing portions 51 to cover the front surface of the printed circuit board 30 to the greatest degree possible. For this reason, a ring-shaped pressing portion 51 may have parts that cross the facing long sides and the facing short sides so as to avoid interference with the conductive posts 41*a* to 41*e* on the front surface of the printed circuit board 30.

Modification 1-4

Figure 11:
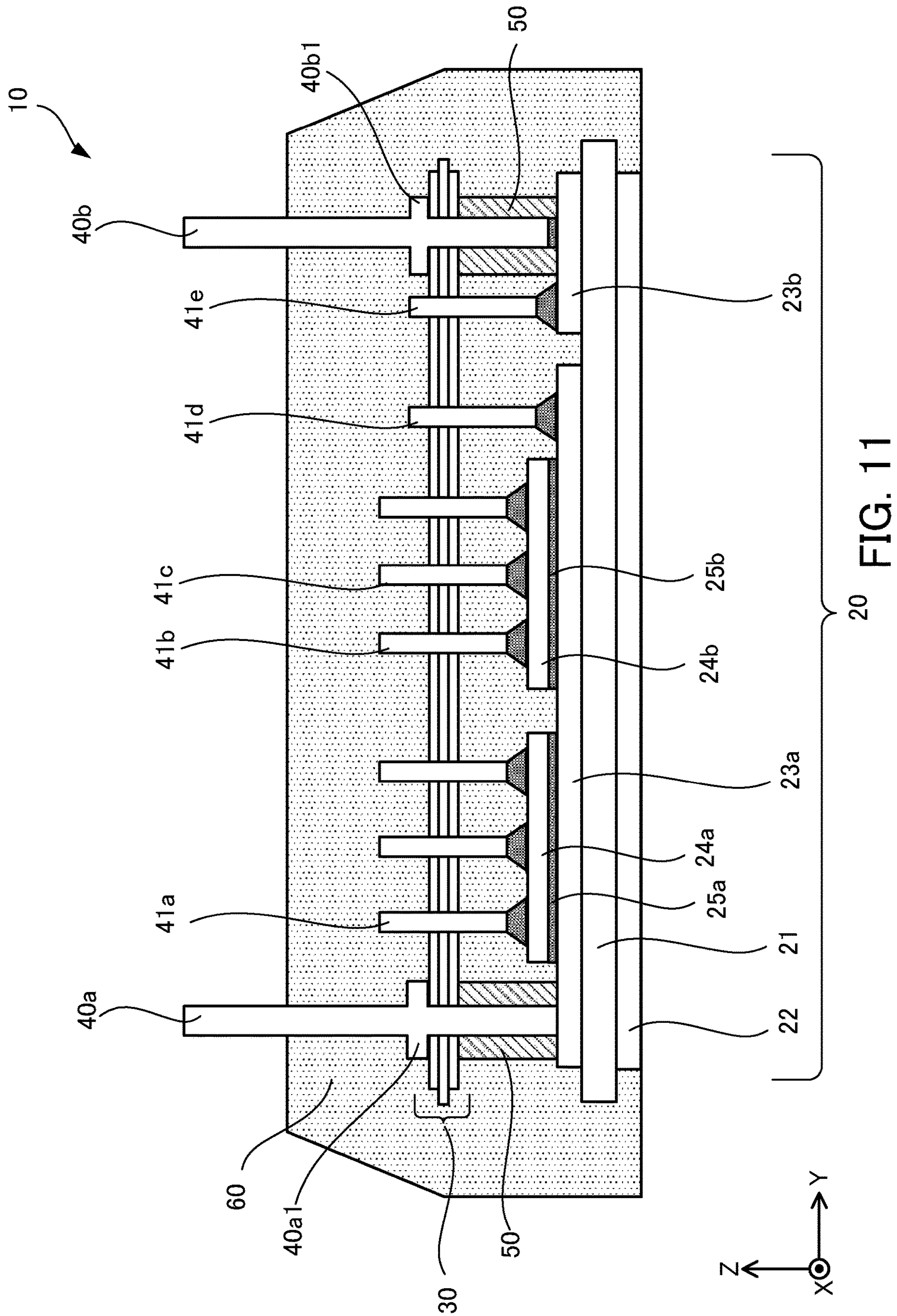
FIG. 11 is a side cross-sectional view of a semiconductor device according to Modification 1-4 of the first embodiment.
Figure 12:
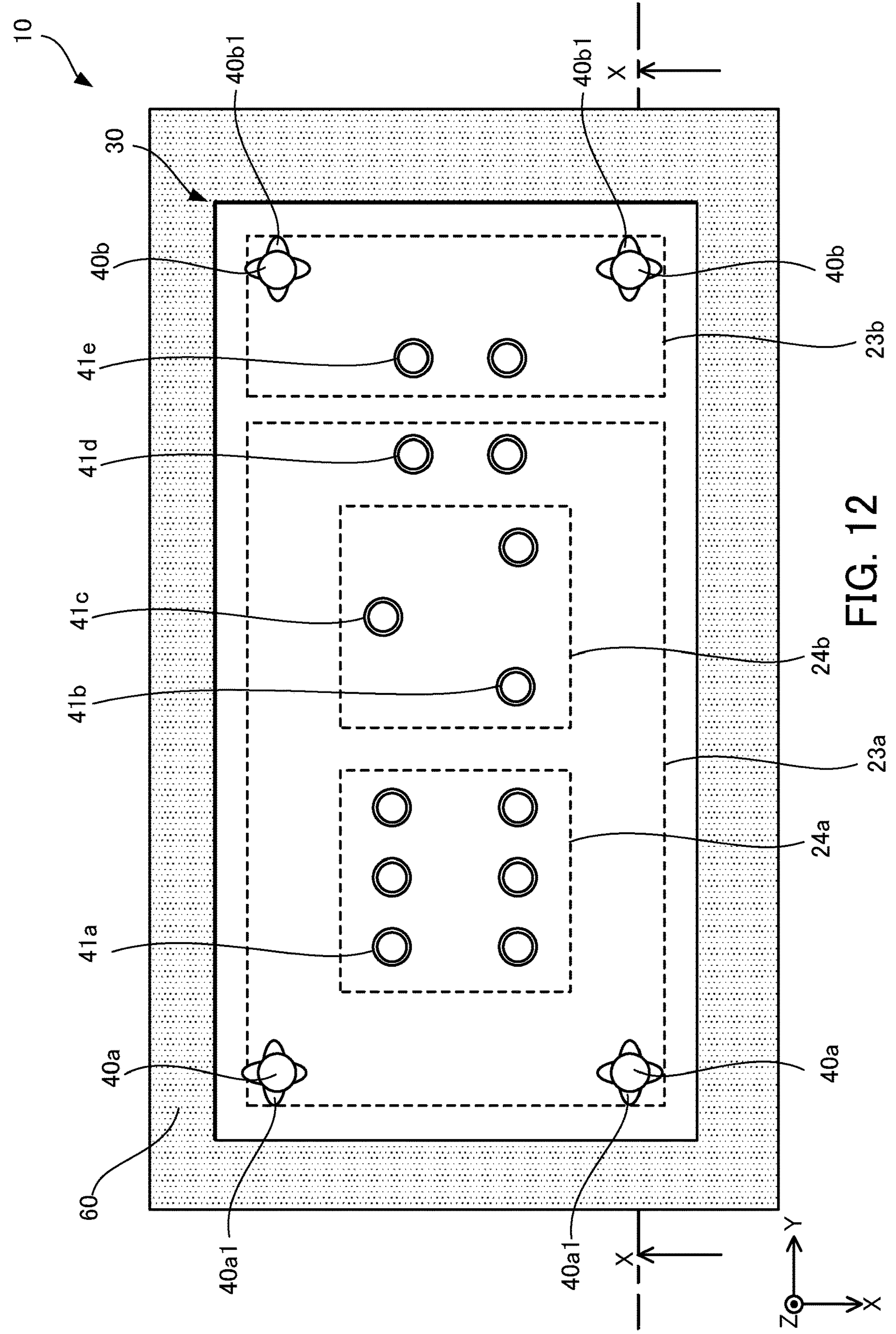
FIG. 12 is a plan view of the semiconductor device according to Modification 1-4 of the first embodiment.

A semiconductor device 10 according to Modification 1-4 will now be described with reference to FIGS. 11 and 12. FIG. 11 is a side cross-sectional view of the semiconductor device according to Modification 1-4 of the first embodiment, and FIG. 12 is a plan view of the semiconductor device according to Modification 1-4 of the first embodiment. Note that FIG. 11 is a cross-sectional view taken along the dot-dash line X-X in FIG. 12. FIG. 12 is a plan view of the printed circuit board 30 with an upper portion of the encapsulating member 60 in FIG. 11 removed.

In the semiconductor device 10 according to Modification 1-4, the pressing portions 51 in the semiconductor device 10 in FIGS. 1 and 2 are not provided, and pressing members 40*a*1 and 40*b*1 are formed on outer peripheral surfaces of the external terminals 40*a* and 40*b*. As depicted in FIG. 11, in side view, the pressing members 40*al* and 40*b*1 protrude outward from the outer peripheral surfaces of the external terminals 40*a* and 40*b* perpendicularly (that is, on an X-Y plane) to the direction (or "+Z direction") in which the external terminals 40*a* and 40*b* extend. As depicted in FIG. 12, the pressing members 40*al* and 40*b*1 protrude outward in four directions from the outer peripheral surfaces of the external terminals 40*a* and 40*b* in plan view.

The external terminals 40*a* and 40*b* are prepared in advance in step S1 in FIG. 3, and once the mounting process (step S3 in FIG. 3) of mounting the printed circuit board 30, to which the external terminals 40*a* and 40*b* have been attached, on the insulated circuit board 20 has been performed, the printed circuit board 30 is pressed toward the spacer portions 50 by the pressing members 40*al* and 40*b*1. This means that warping of the printed circuit board 30 may be corrected without performing step S4 in FIG. 3 (that is, without using the pressing portions 51).

Accordingly, the semiconductor device 10 according to Modification 1-4 may be manufactured without using the pressing portions 51 and with fewer manufacturing processes compared to FIGS. 1 and 2 and Modifications 1-1 to 1-3, which may reduce the manufacturing cost.

Note that as one example of the pressing members 40*a*1 and 40*b*1 of the external terminals 40*a* and 40*b* according to Modification 1-4, forging may be performed on the external terminals 40*a* and 40*b* to cause the pressing members 40*al* and 40*b*1 to protrude outward. Alternatively, the pressing members 40*a*1 and 40*b*1 may be bonded to the external terminals 40*a* and 40*b* by welding. It is sufficient for the pressing members 40*a*1 and 40*b*1 to press the printed circuit board 30 toward the spacer portions 50. For this reason, the shape of the pressing members 40*a*1 and 40*b*1 is not limited to the shape depicted in FIG. 12. As one example, two or more pressing members 40*al* and 40*b*1 may be formed around the outer periphery on the outer peripheral surfaces of the external terminals 40*a* and 40*b* at equal intervals in plan view. Alternatively, the pressing members 40*al* and 40*b*1 may be formed in ring shapes or fan shapes around the outer periphery of the outer peripheral surfaces of the external terminals 40*a* and 40*b* in plan view.

The lengths of the pressing members 40*al* and 40*b*1 formed on the external terminals 40*a* and 40*b* do not need to be isotropic. Since the external terminals 40*a* and 40*b* are provided at the four corners of the printed circuit board 30, the lengths of the pressing members 40*al* and 40*b*1 that face the outside of the printed circuit board 30 from the external terminals 40*a* and 40*b* are limited so as not to protrude outside the printed circuit board 30. On the other hand, the pressing members 40*al* and 40*b*1 that face the inside of the printed circuit board 30 from the external terminals 40*a* and 40*b* may be longer than the pressing members 40*al* and 40*b*1 that face the outside.

Modification 1-5

Figure 13:
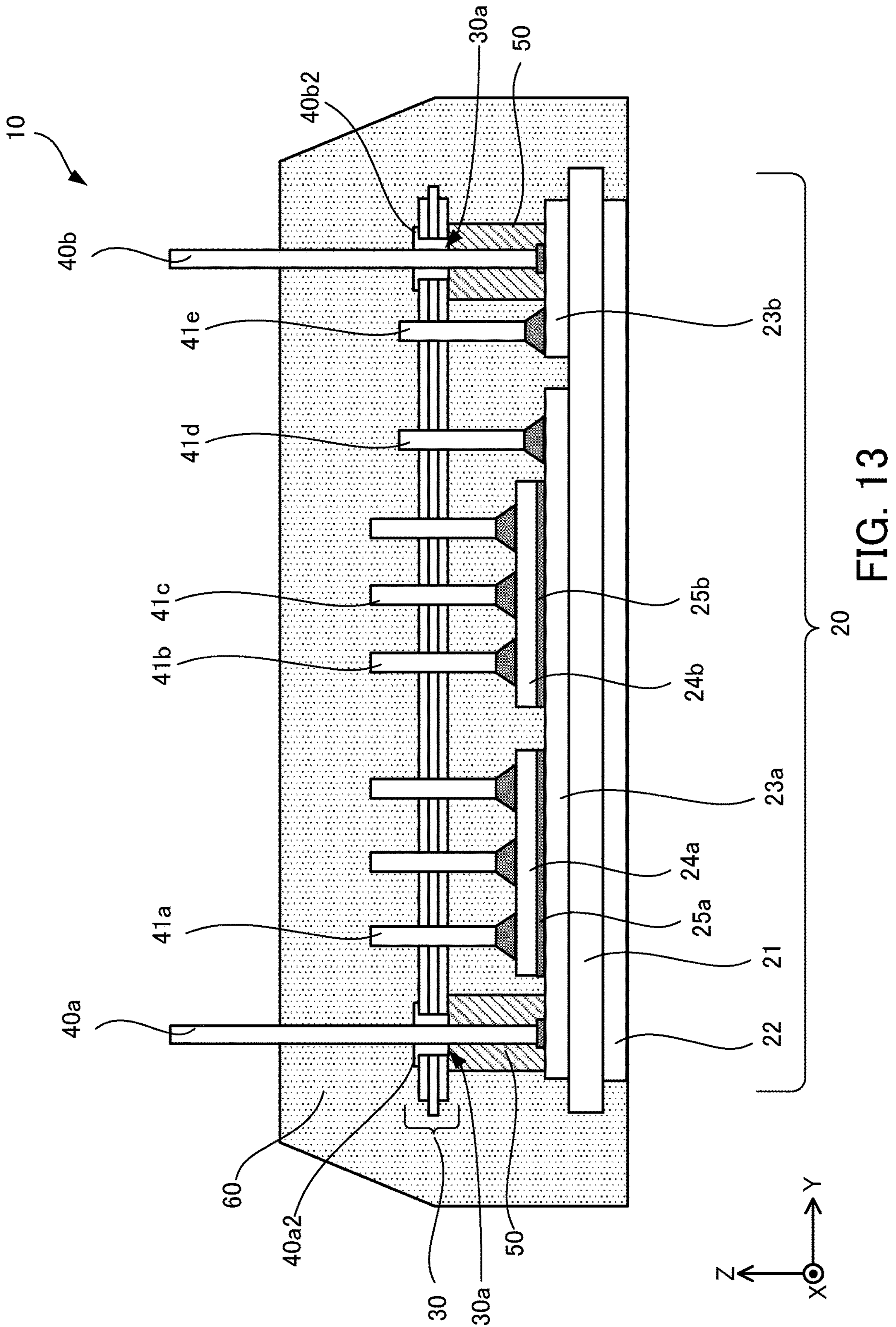
FIG. 13 is a side cross-sectional view of a semiconductor device according to Modification 1-5 of the first embodiment.
Figure 14:
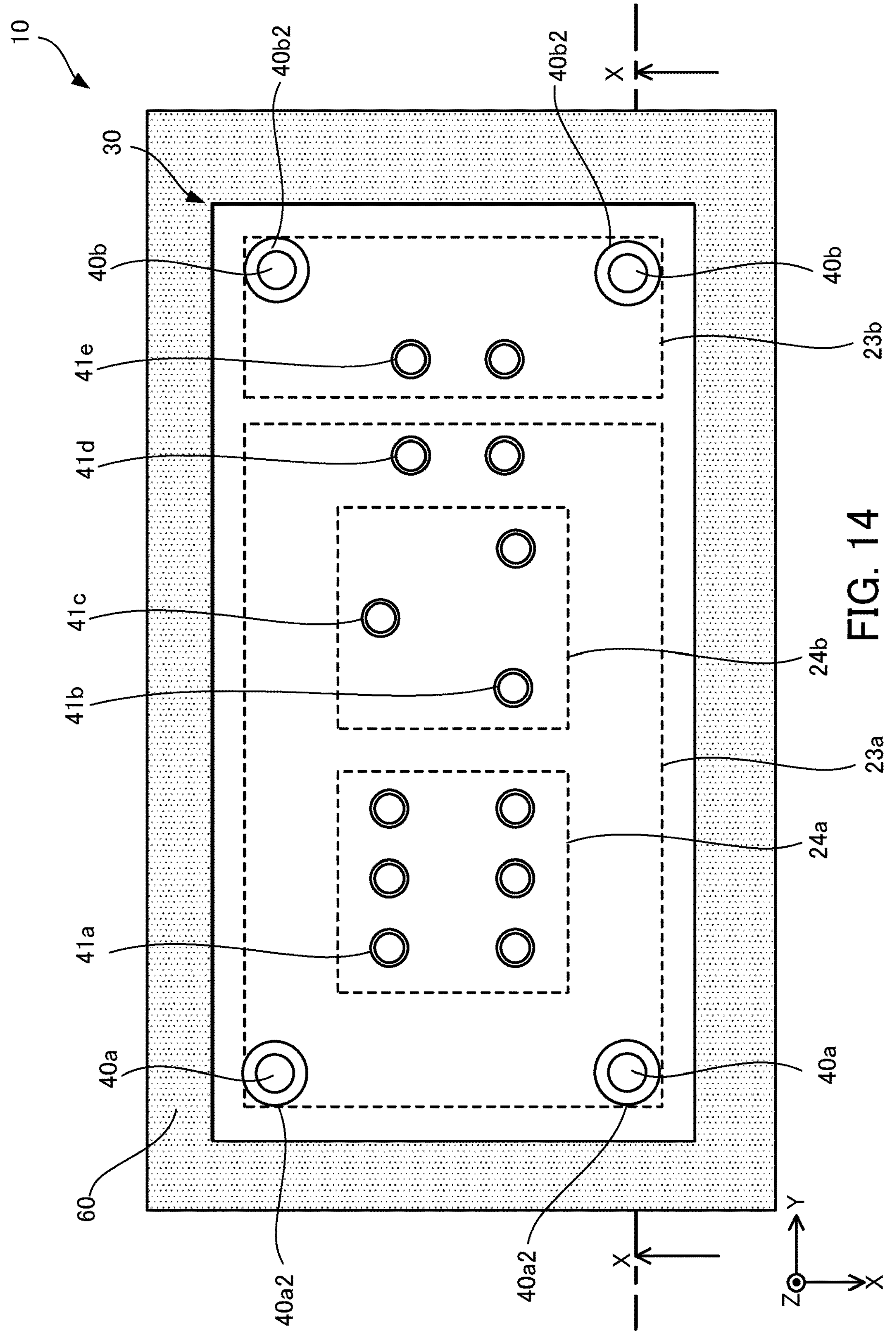
FIG. 14 is a plan view of the semiconductor device according to Modification 1-5 of the first embodiment.

A semiconductor device 10 according to Modification 1-5 will now be described with reference to FIGS. 13 and 14. FIG. 13 is a side cross-sectional view of the semiconductor device according to Modification 1-5 of the first embodiment, and FIG. 14 is a plan view of the semiconductor device according to Modification 1-5 of the first embodiment. Note that FIG. 13 is a cross-sectional view taken along the dot-dash line X-X in FIG. 14. FIG. 14 is a plan view of the printed circuit board 30 with an upper portion of the encapsulating member 60 in FIG. 13 removed.

The semiconductor device 10 according to Modification 1-5 does not use the pressing portions 51 in the semiconductor device 10 in FIGS. 1 and 2 and instead has wedge members 40*a*2 and 40*b*2 inserted around the external terminals 40*a* and 40*b* in the through-holes 30*a* of the printed circuit board 30 through which the external terminals 40*a* and 40*b* have been inserted. Note that the diameters of the through-holes 30*a* are formed several percent larger than the diameter of the through-holes in the printed circuit board 30 in FIGS. 1 and 2 through which the external terminals 40*a* and 40*b* are inserted.

The wedge members 40*a*2 and 40*b*2 are tube shaped. The inner diameters of the wedge members 40*a*2 and 40*b*2 (the diameters of the inner surfaces in plan view) may be the same as or several percent smaller than the diameters of the external terminals 40*a* and 40*b*. The outer diameter of the wedge members 40*a*2 and 40*b*2 (that is, the diameter of the outer surface in plan view) may be the same as the diameter of the through-holes 30*a* in the printed circuit board 30 or several percent larger. The diameters of the outer surfaces of the wedge members 40*a*2 and 40*b*2 may also decrease in the −Z direction. By doing so, it becomes easier to insert the wedge members 40*a*2 and 40*b*2 into the gaps between the external terminals 40*a* and 40*b* and the through-holes 30*a* and 30*b*. In addition, flanges are integrally formed on front surface-sides of the wedge members 40*a*2 and 40*b*2. Each flange may be sized so as not to protrude from the front surface of the printed circuit board 30 when the wedge members 40*a*2 and 40*b*2 have been attached. The wedge members 40*a*2 and 40*b*2 are also made of a material that is resistant to heat and has a small coefficient of thermal expansion as a main component. Example materials include ceramics, carbon, and composite materials including ceramic and/or carbon.

Next, a method of manufacturing the semiconductor device 10 including the wedge members 40*a*2 and 40*b*2 will be described with reference to FIG. 3. Note that the description here will focus on the differences with FIG. 3. First, in step S1 of FIG. 3, the wedge members 40*a*2 and 40*b*2 are also prepared as parts that form the semiconductor device 1.

Next, in step S2*b* of FIG. 3, the external terminals 40*a* and 40*b* are inserted through the through-holes 30*a* of the printed circuit board 30. After this, the wedge members 40*a*2 and 40*b*2 are inserted onto the external terminals 40*a* and 40*b* and driven between the external terminals 40*a* and 40*b* and the through-holes 30*a*. The external terminals 40*a* and 40*b* are fixed to the printed circuit board 30 by the wedge members 40*a*2 and 40*b*2.

Next, in step S3 of FIG. 3, the printed circuit board 30 is mounted on the insulated circuit board 20. At this time, the lower end portions of the external terminals 40*a* and 40*b* fixed to the printed circuit board 30 are inserted through the through-holes 50*a* of the spacer portions 50 and come into contact with the front surface of the insulated circuit board 20. The printed circuit board 30 is fixed to the external terminals 40*a* and 40*b*, and the front surface of the printed circuit board 30 is pressed toward the spacer portions 50 by the flanges of the wedge members 40*a*2 and 40*b*2.

After this, the processing of step S5 is performed without performing step S4 in FIG. 3 (that is, without using the pressing portions 51). Since the front surface of the printed circuit board 30 is pressed toward the spacer portions 50 by the flanges of the wedge members 40*a*2 and 40*b*2, warping of the printed circuit board 30 caused by heating may be corrected. Since the printed circuit board 30 is kept horizontal, the lower end portions of the conductive posts 41*a* to 41*e* do not become separated from the insulated circuit board 20 and the semiconductor chips 24*a* and 24*b*, so that the lower end portions are reliably bonded in a state where contact between the lower end portions and the insulated circuit board 20 and the semiconductor chips 24*a* and 24*b* is maintained. After this, the encapsulating process of step S6 in FIG. 3 is performed to obtain the semiconductor device 10 depicted in FIGS. 13 and 14.

Accordingly, compared with FIGS. 1 and 2 and Modifications 1-1 to 1-3, the semiconductor device 10 according to Modification 1-5 may be manufactured without using the pressing portions 51 and with fewer manufacturing processes, which may reduce the manufacturing cost.

Modification 1-6

Figure 15:
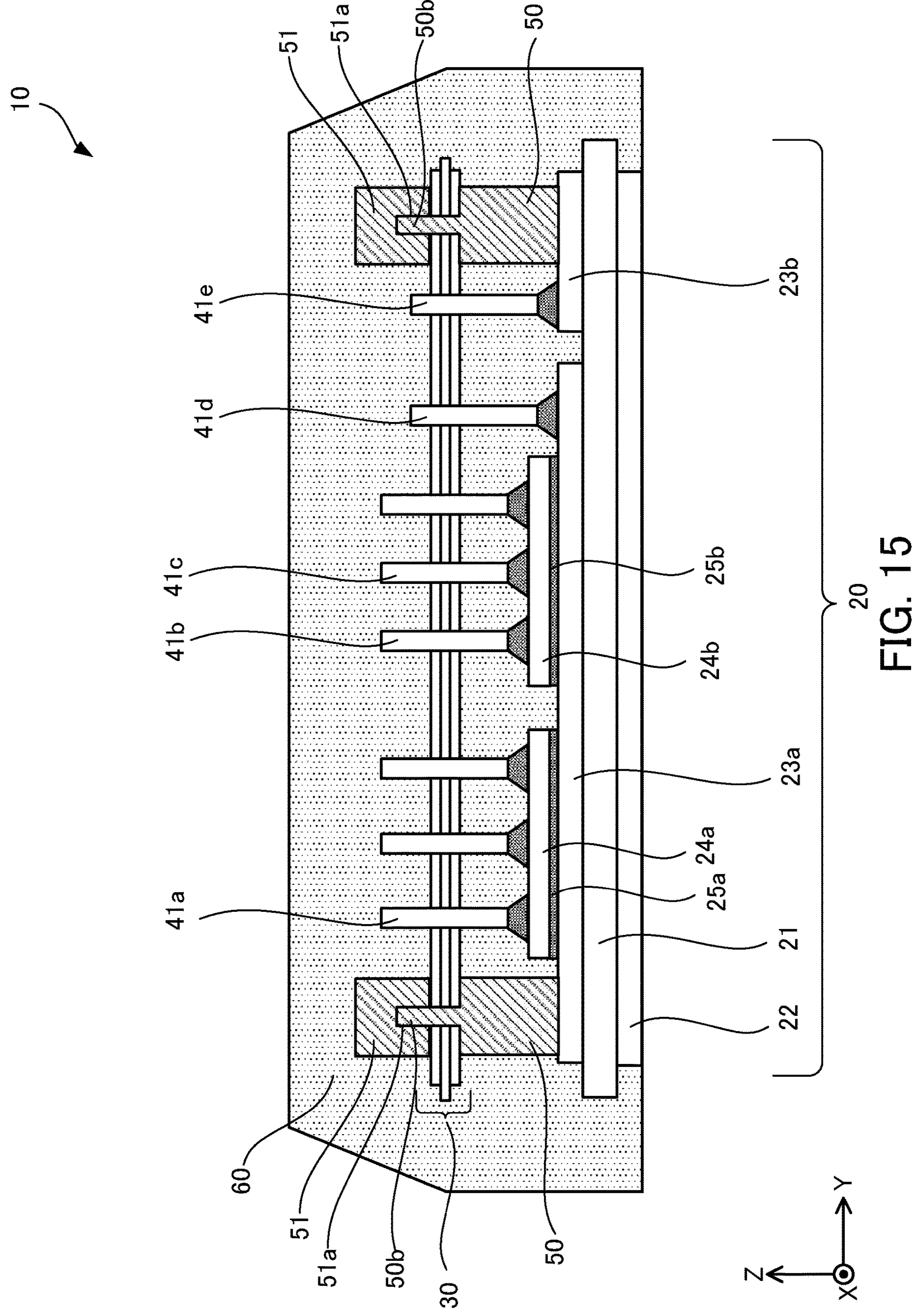
FIG. 15 is a side cross-sectional view of a semiconductor device according to Modification 1-6 of the first embodiment.
Figure 16:
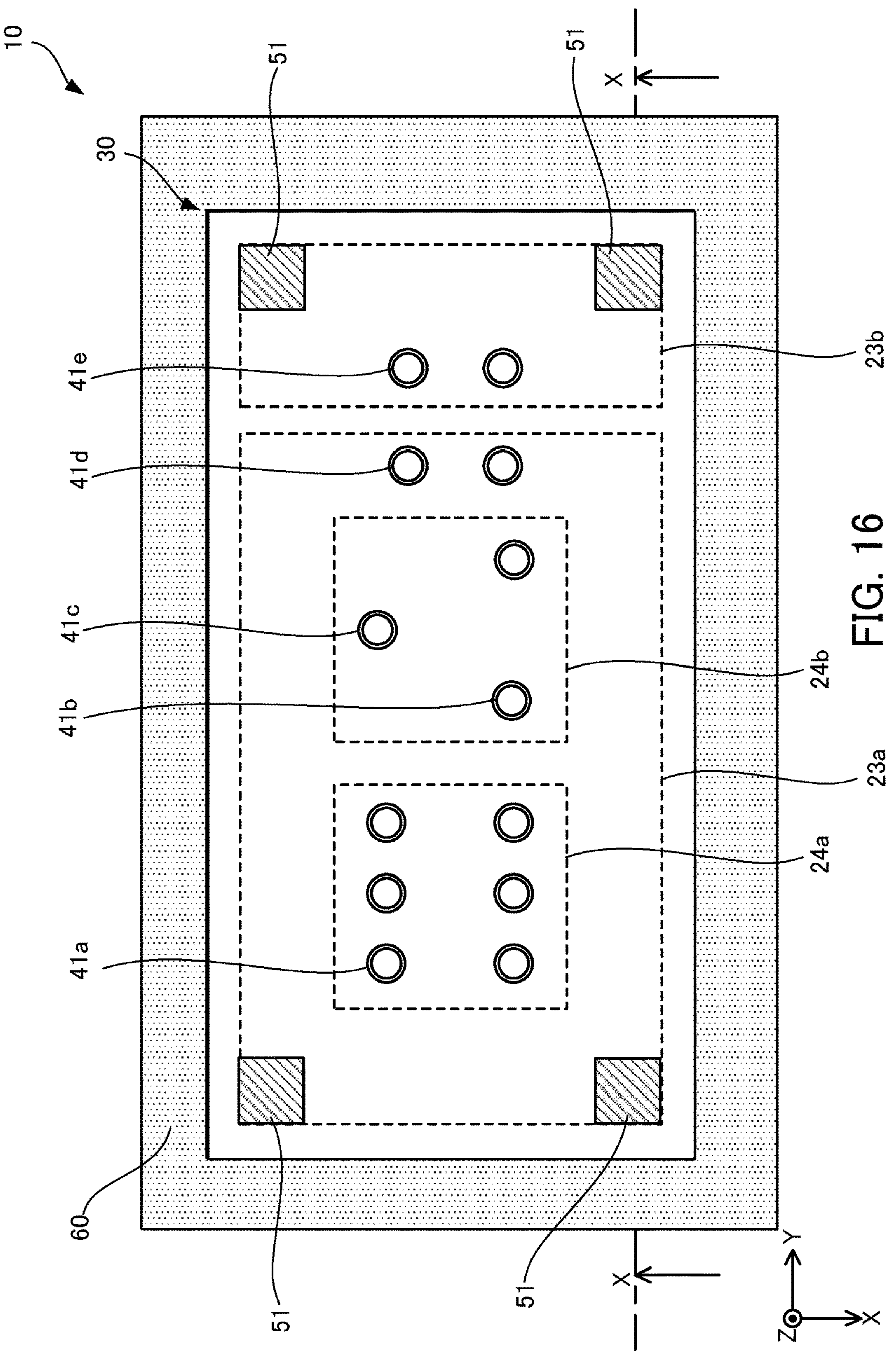
FIG. 16 is a plan view of the semiconductor device according to Modification 1-6 of the first embodiment.

A semiconductor device 10 according to Modification 1-6 will now be described with reference to FIGS. 15 and 16. FIG. 15 is a side cross-sectional view of the semiconductor device according to Modification 1-6 of the first embodiment, and FIG. 16 is a plan view of the semiconductor device according to Modification 1-6 of the first embodiment. Note that FIG. 15 is a cross-sectional view taken along the dot-dash line X-X in FIG. 16. FIG. 16 is a plan view of the printed circuit board 30 with an upper portion of the encapsulating member 60 in FIG. 15 removed.

As the semiconductor device 10 according to Modification 1-6, a configuration where the external terminals 40*a* and 40*b* are not provided will be described as an example. In this semiconductor device 10, convex portions (convex members) 50*b* that extend vertically upward (in the +Z direction) with respect to the front surface of the insulated circuit board 20 are formed on the upper surfaces of the spacer portions 50 that face the pressing portions 51. Through-holes (not illustrated) at the four corners of the printed circuit board 30 are disposed on the spacer portions 50, with the convex portions 50*b* inserted therethrough. The convex portions 50*b* may be circular prisms or polygonal prisms. The convex portions 50*b* need to be longer than the thickness of the printed circuit board 30.

The through-holes 51*a* are formed in the lower surfaces of the pressing portions 51 that face the spacer portions 50. The through-holes 51*a* have shapes and sizes corresponding to the convex portions 50*b*. The through-holes 51*a* may pass through from the rear surface to the front surface of the pressing portions 51, as depicted in FIG. 1, or do not need to pass through the front surface, as depicted in FIG. 15. The convex portions 50*b* that protrude the front surface of the printed circuit board 30 are fitted into the through-holes 51*a* of the pressing portions 51, so that the printed circuit board 30 is interposed between the pressing portions 51 and the spacer portions 50.

Next, a method for manufacturing the semiconductor device 10 including the spacer portions 50 and the pressing portions 51 described above will be described with reference to FIG. 3. Note that like above, the description here will focus on the differences with FIG. 3. First, in step S1 of FIG. 3, the spacer portions 50 provided with the convex portions 50*b* and the pressing portions 51 in which the through-holes 51*a* are formed are prepared. Note that the external terminals 40*a* and 40*b* are not included in this configuration.

Next, in step S3 in FIG. 3, the printed circuit board 30 that was assembled in step S2*b* is mounted via the spacer portions 50 on the insulated circuit board 20. At this time, the convex portions 50*b* of the spacer portions 50 are passed through the four corners of the printed circuit board 30, and the lower end portions of the conductive posts 41*a* to 41*e* of the printed circuit board 30 are mounted on the semiconductor chips 24*a* and 24*b* and the circuit patterns 23*a* and 23*b* on which plate solder has been disposed.

Next, in step S4 of FIG. 3, the convex portions 50*b* that protrude from the printed circuit board 30 are inserted into the through-holes 51*a* to attach the pressing portions 51 onto the spacer portions 50 with the printed circuit board 30 in between. Since convex portions 50*b* of the spacer portions 50 are inserted through the printed circuit board 30, movement of the printed circuit board 30 in directions on a plane (the X-Y plane) is restricted. Since the printed circuit board 30 is interposed between the pressing portions 51 and the spacer portions 50, movement in the vertical direction (+Z direction) is also restricted. Next, the processing in step S5 in FIG. 3 is performed. At this time, even when the printed circuit board 30 tries to warp due to the heat, the pressing portions 51 will press the printed circuit board 30 toward the spacer portions 50. As a result, the warping of the printed circuit board 30 is corrected and the printed circuit board 30 is kept substantially horizontal. This means that the lower end portions of the conductive posts 41*a* to 41*e* are kept in contact with the insulated circuit board 20 and the semiconductor chips 24*a* and 24*b*. As a result, the conductive posts 41*a* to 41*e* are reliably bonded to the insulated circuit board 20 and the semiconductor chips 24*a* and 24*b*. Finally, the processing in step S6 in FIG. 3 is performed to obtain the semiconductor device 10 in FIGS. 15 and 16.

Accordingly, even when the semiconductor device 10 according to Modification 1-6 does not include the external terminals 40*a* and 40*b*, since the convex portions 50*b* are formed in the spacer portions 50 and the through-holes 51*a* are formed in the pressing portions 51, warping of the printed circuit board 30 is corrected and it is possible to maintain the contact between the lower end portions of the conductive posts 41*a* to 41*e* and the insulated circuit board 20 and the semiconductor chips 24*a* and 24*b*. As a result, the mechanical and electrical connections of the conductive posts 41*a* to 41*e* are maintained, and deterioration in the reliability of the semiconductor device 10 is suppressed.

In Modification 1-6, a configuration where the convex portions 50*b* and the through-holes 51*a* are respectively formed in the spacer portions 50 and the pressing portions 51 has been described. However, this is not a limitation for the present disclosure and the convex portions 50*b* may be formed on the lower surfaces of the pressing portions 51 and the through-holes 51*a* may be formed in the upper surfaces of the spacer portions 50.

Second Embodiment

Figure 17:
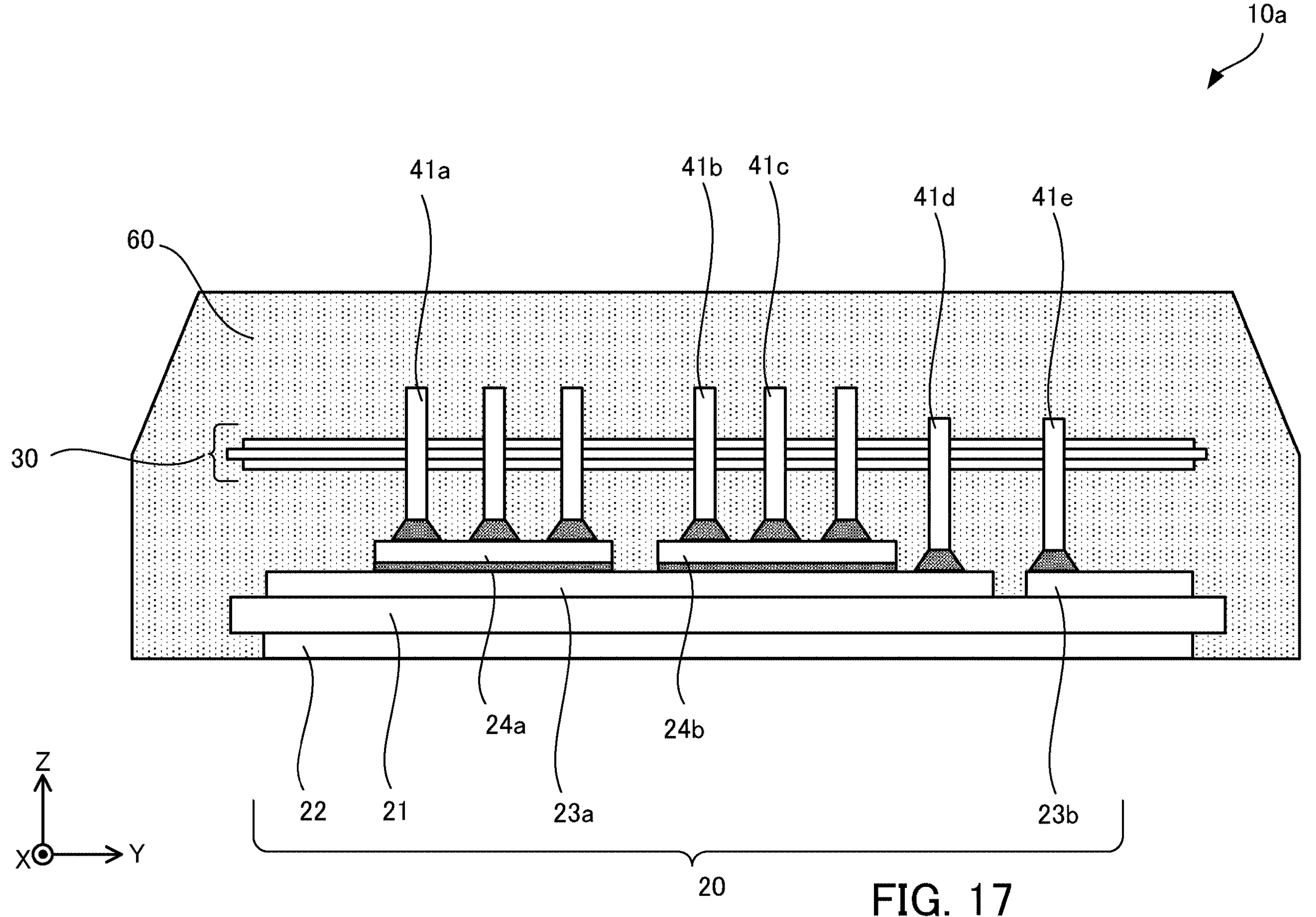
FIG. 17 is a side cross-sectional view of a semiconductor device according to a second embodiment.

In the second embodiment, a semiconductor device that does not include external terminals will be described. Note that in this second embodiment, configurations that are the same as in the semiconductor device 10 according to the first embodiment have been assigned the same reference numerals and the description thereof is simplified or omitted. First, a semiconductor device of this type will be described with reference to FIGS. 17 and 18. FIG. 17 is a side cross-sectional view of the semiconductor device according to the second embodiment, and FIG. 18 is a plan view of the semiconductor device according to the second embodiment.

Figure 18:
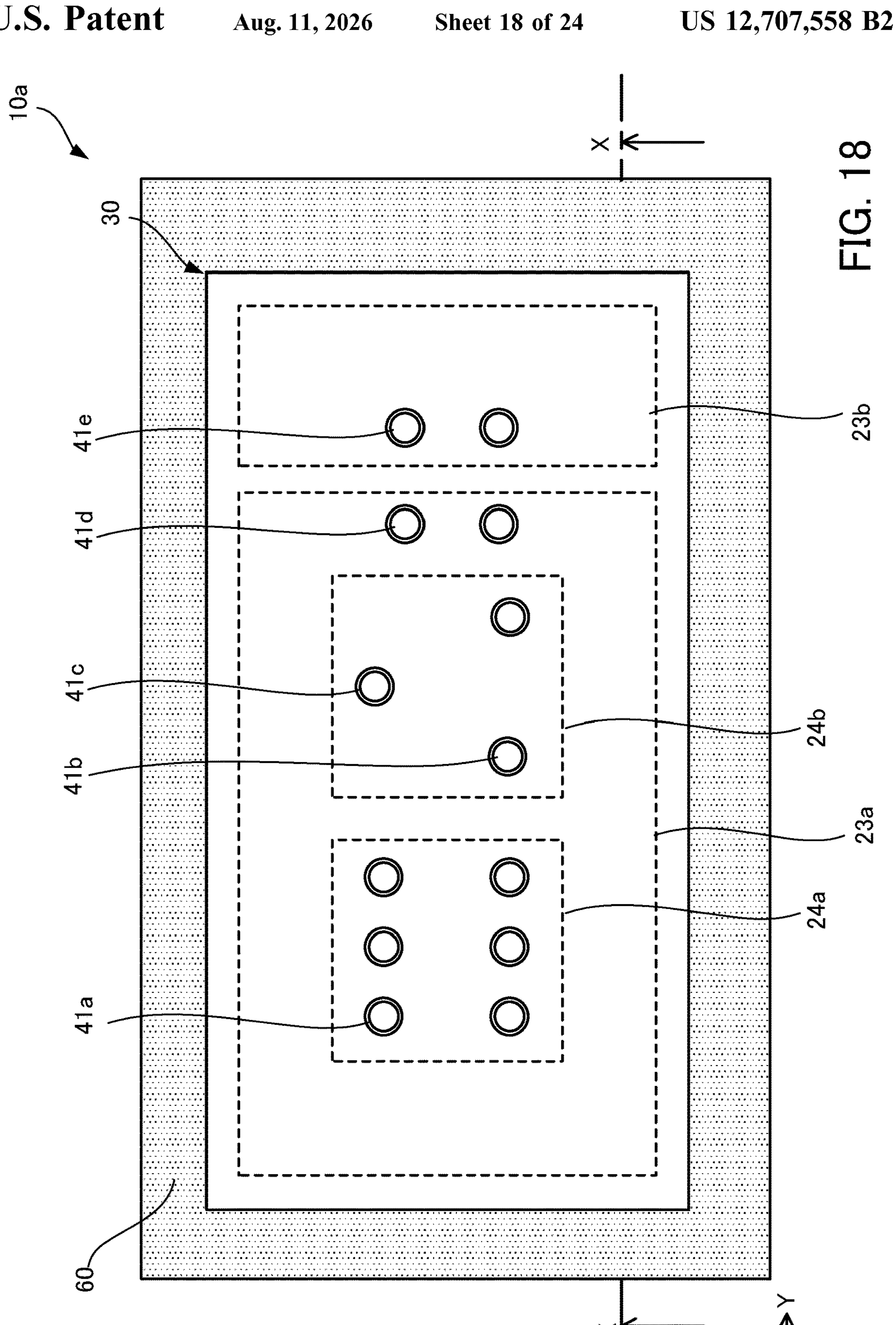
FIG. 18 is a plan view of the semiconductor device according to the second embodiment.

As depicted in FIGS. 17 and 18, a semiconductor device 10*a* includes the insulated circuit board 20, the semiconductor chips 24*a* and 24*b*, the printed circuit board 30, and the conductive posts 41*a* to 41*e*. Also, unlike the semiconductor device 10 according to the first embodiment, the semiconductor device 10*a* does not include the external terminals 40*a* and 40*b*, the spacer portions 50, and the pressing portions 51. The components of the semiconductor device 10*a* are encapsulated by the encapsulating member 60. The semiconductor device 10*a* is also encapsulated with the encapsulating member 60 so as to expose the rear surface of the insulated circuit board 20 (that is, the rear surface of the metal plate 22).

Figure 19:
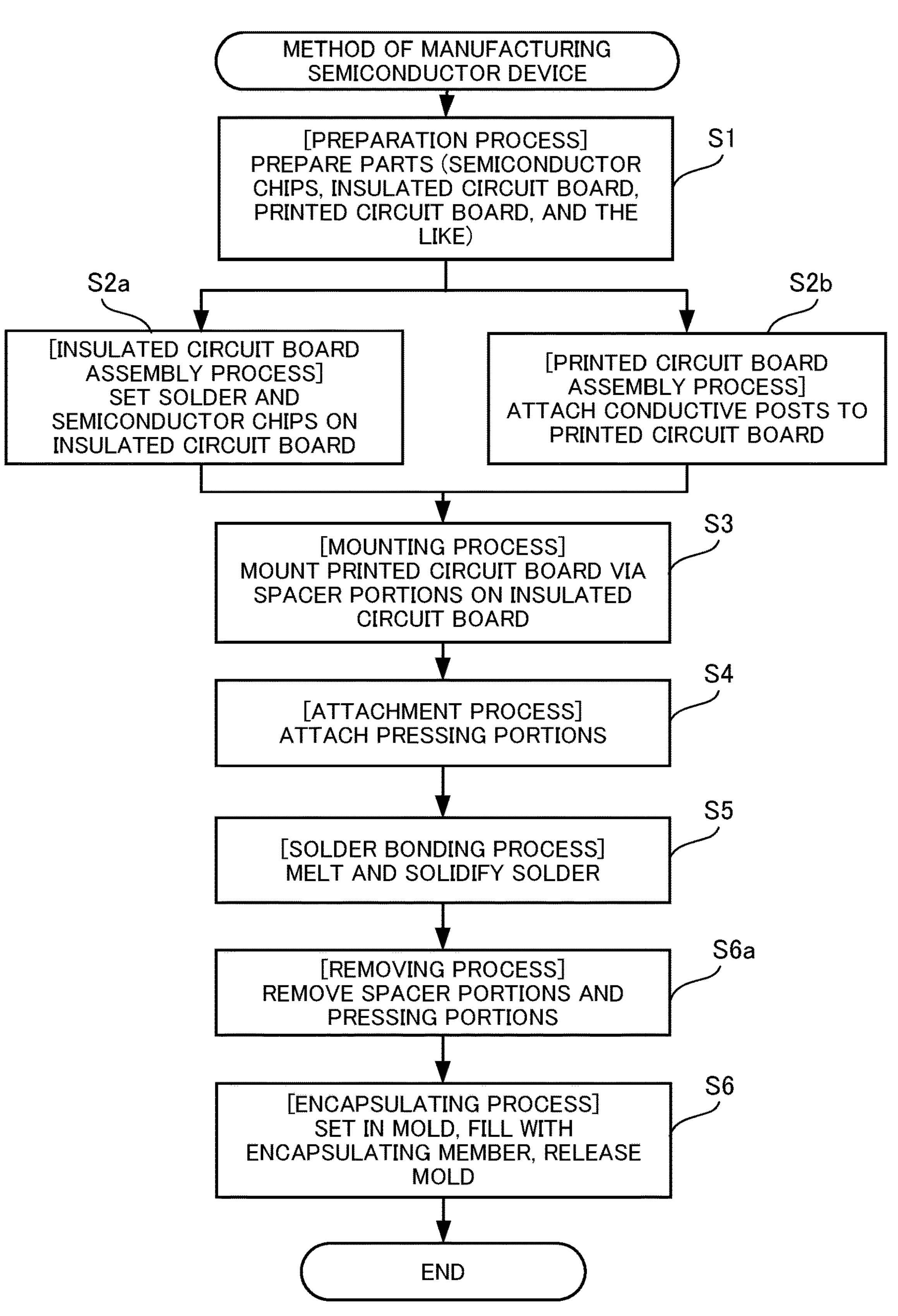
FIG. 19 is a flowchart of a method of manufacturing a semiconductor device according to the second embodiment.
Figure 20:
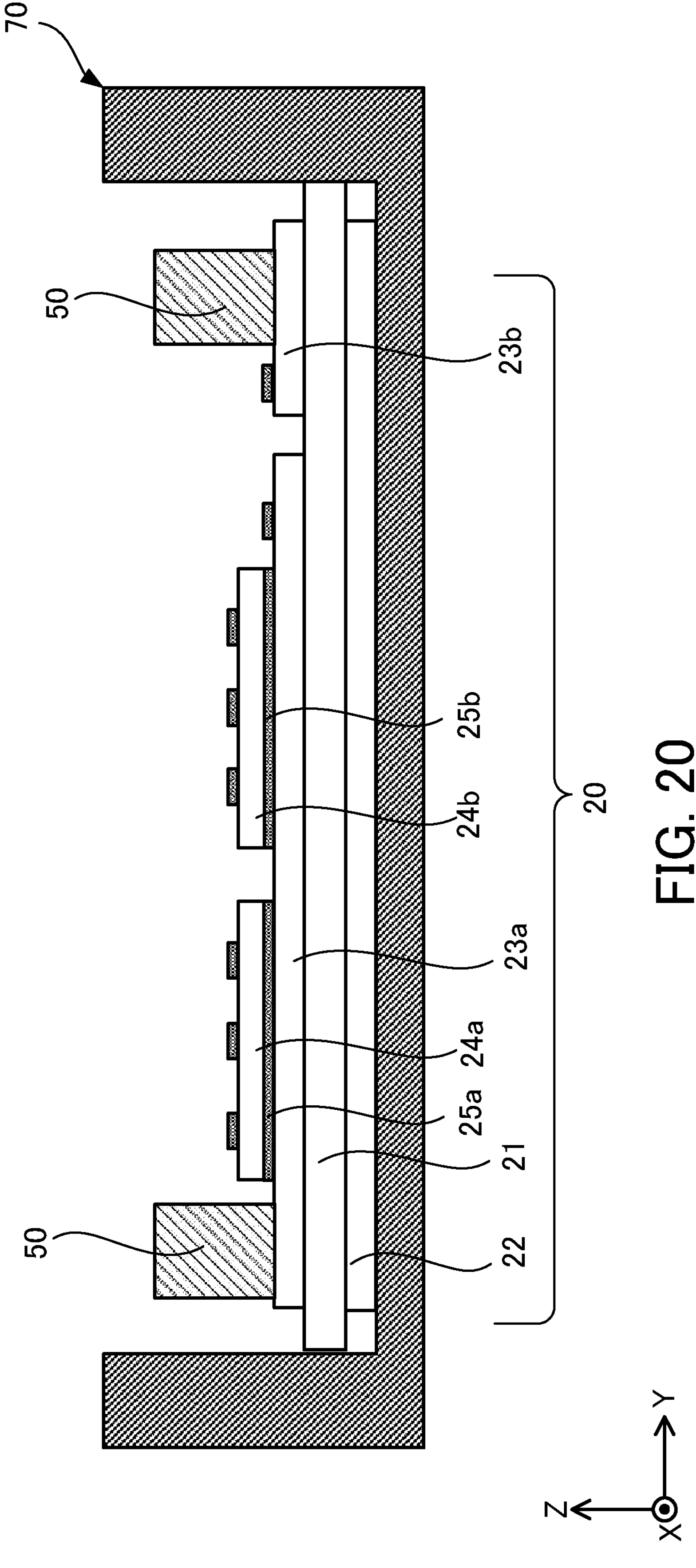
FIG. 20 is a first diagram depicting a mounting process included in the method of manufacturing a semiconductor device according to the second embodiment.
Figure 21:
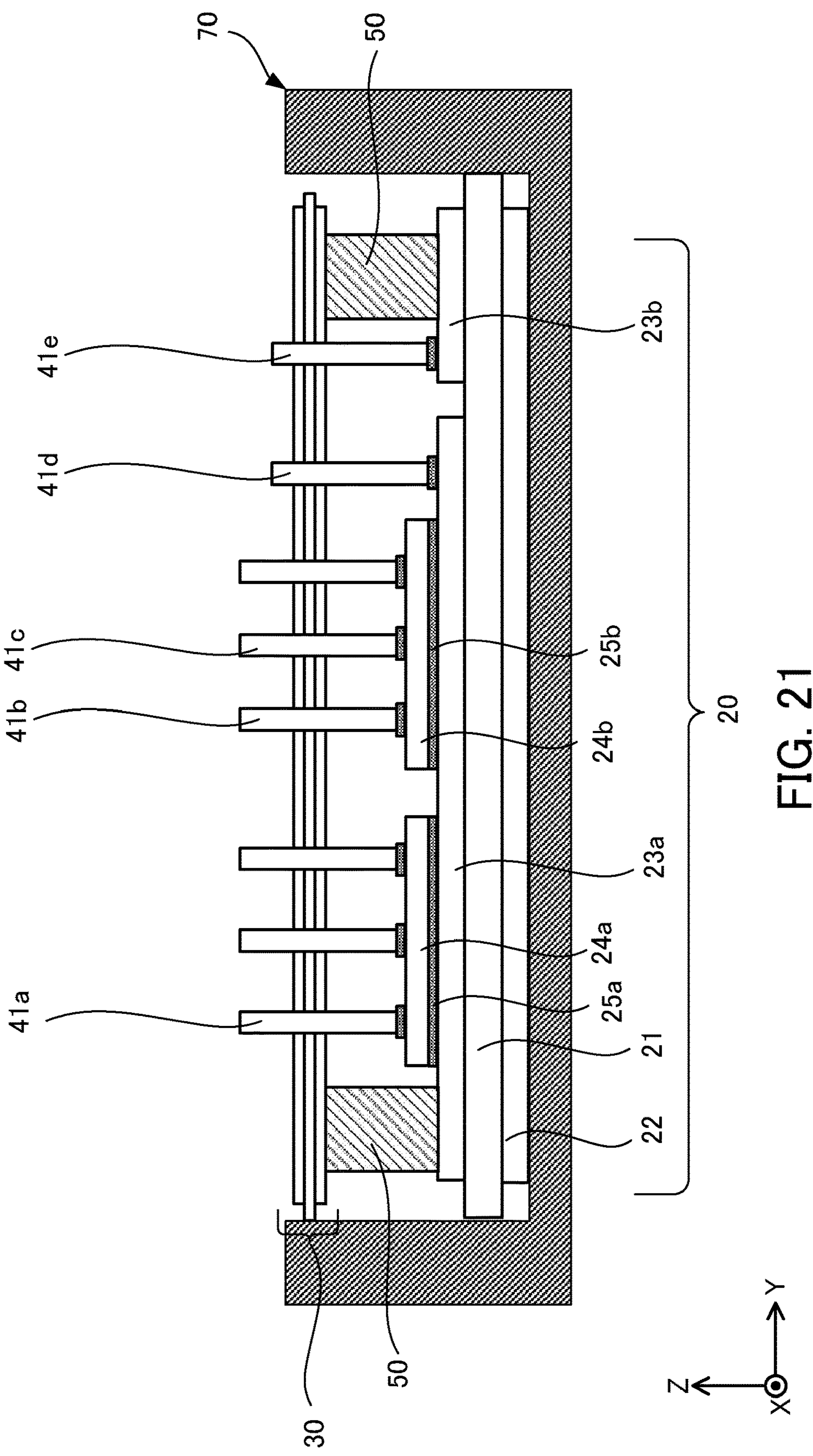
FIG. 21 is a second diagram depicting the mounting process included in the method of manufacturing a semiconductor device according to the second embodiment.
Figure 22:
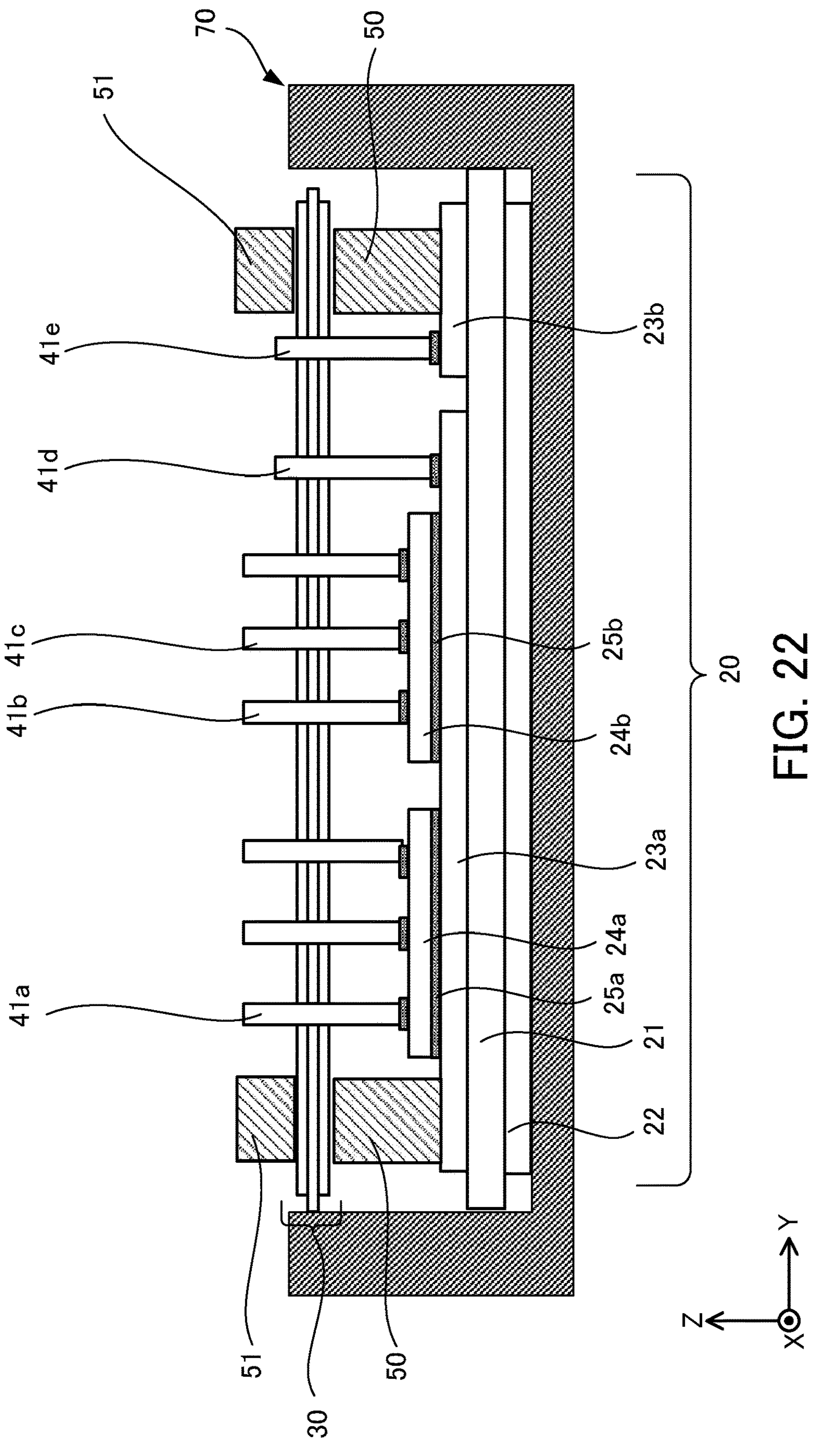
FIG. 22 depicts an attachment process included in the method of manufacturing a semiconductor device according to the second embodiment.

Next, a method of manufacturing the semiconductor device 10*a* will be described with reference to FIGS. 19 to 22 and FIGS. 17 and 18. FIG. 19 is a flowchart of a method of manufacturing a semiconductor device according to the second embodiment. FIGS. 20 and 21 depict a mounting process included in the method of manufacturing the semiconductor device according to the second embodiment, and FIG. 22 depicts an attachment process included in the method of manufacturing the semiconductor device according to the second embodiment. Note that the description will focus on processes that differ from the method of manufacturing in FIG. 3 of the first embodiment.

First, a preparation process (step S1) is performed to prepare parts that construct the semiconductor device 10. In the preparation process, the semiconductor chips 24*a* and 24*b*, the insulated circuit board 20, the conductive posts 41*a* to 41*e*, the printed circuit board 30, the spacer portions 50, the pressing portions 51, and the like are prepared.

Next, an insulated circuit board assembly process (step S2*a*) is performed to dispose solder, semiconductor chips 24*a* and 24*b*, and the like on the insulated circuit board 20 and a printed circuit board assembly process (step S2*b*) is performed to attach the conductive posts 41*a* to 41*e* to the printed circuit board 30. Note that either the insulated circuit board assembly process (step S2*a*) or the printed circuit board assembly process (step S2*b*) may be performed first.

In the insulated circuit board assembly process (step S2*a*), as depicted in FIG. 20, the insulated circuit board 20 is set inside a mold 70 and the semiconductor chips 24*a* and 24*b* are disposed via plate solder (not illustrated) in predetermined regions of the circuit pattern 23*a* of the insulated circuit board 20. Plate solder is disposed in the same way in regions of the circuit patterns 23*a* and 23*b* of the insulated circuit board 20 and the semiconductor chips 24*a* and 24*b* where the conductive posts 41*a* to 41*e* are to be bonded. In addition, the spacer portions 50 are disposed at the four corners of the insulated circuit board 20. In the printed circuit board assembly process (step S2*b*), the conductive posts 41*a* to 41*e* may be inserted through predetermined through-holes in the printed circuit board 30 and bonded by solder.

Next, a mounting process (step S3) is performed to mount the printed circuit board 30 on the insulated circuit board 20 obtained in steps S2*a* and S2*b*. The printed circuit board 30 assembled in step S2*b* is mounted on the insulated circuit board 20 assembled in step S2*a*. By doing so, as depicted in FIG. 21, the printed circuit board 30 is disposed on the spacer portions 50, and the lower end portions of the conductive posts 41*a* to 41*e* on the printed circuit board 30 are placed in contact with the semiconductor chips 24*a* and 24*b* and the circuit patterns 23*a* and 23*b* on which plate solder has been disposed.

Next, an attachment process is performed to attach the pressing portions 51 to the front surface of the printed circuit board 30 (step S4). As depicted in FIG. 22, the pressing portions 51 are attached to the spacer portions 50 with the printed circuit board 30 disposed in between. Since the printed circuit board 30 is interposed between the pressing portions 51 and the spacer portions 50, movement in the vertical direction (in the +Z direction) is restricted.

Next, a solder bonding process (step p S5) is performed to add heat to melt the solder and then perform cooling to create solder bonds. When doing so, even when warping of the printed circuit board 30 occurs due to the heating, the printed circuit board 30 is pressed toward the spacer portions 50 by the pressing portions 51. By doing so, the warping of the printed circuit board 30 is corrected, and the lower end portions of the conductive posts 41*a* to 41*e* are kept in contact with the insulated circuit board 20 and the semiconductor chips 24*a* and 24*b*. By cooling the melted solder, the conductive posts 41*a* to 41*e* are reliably bonded to the insulated circuit board 20 and the semiconductor chips 24*a* and 24*b*.

Next, a removing process (step S6*a*) is performed to remove the spacer portions 50 and the pressing portions 51 from the printed circuit board 30, the insulated circuit board 20, and the semiconductor chips 24*a* and 24*b* which are integrated. The printed circuit board 30, the insulated circuit board 20, and the semiconductor chips 24*a* and 24*b* that are integrated are removed from the mold 70 when removing the spacer portions 50 and the pressing portions 51. The pressing portions 51 are pulled upward to remove the spacer portions 50 to the outside.

Next, an encapsulating process S6) is performed to encapsulate the printed circuit board 30, the insulated circuit board 20, and the semiconductor chips 24*a* and 24*b* that have been integrated with an encapsulating member. The printed circuit board 30, the insulated circuit board 20 and the semiconductor chips 24*a* and 24*b* that have been integrated and from which the spacer portions 50 and the pressing portions 51 have been removed in step Sa are set in a predetermined mold and the inside of the mold is filled with the encapsulating member. When the encapsulating member solidifies, the mold is released to obtain the semiconductor device 10*a* depicted in FIGS. 17 and 18.

In the semiconductor device 10*a* manufactured in this way, warping that occurs in the printed circuit board 30 during the heating included in the manufacturing process may be corrected by the pressing portions 51. That is, since the printed circuit board 30 is kept substantially horizontal, the lower end portions of the conductive posts 41*a* to 41*e* do not become separated from the insulated circuit board 20 and the semiconductor chips 24*a* and 24*b* and therefore remain bonded to the insulated circuit board 20 and the semiconductor chips 24*a* and 24*b*. As a result, the mechanical and electrical connections of the conductive posts 41*a* to 41*e* are maintained, thereby suppressing deterioration in the reliability of the semiconductor device 10*a*.

Third Embodiment

Figure 23:
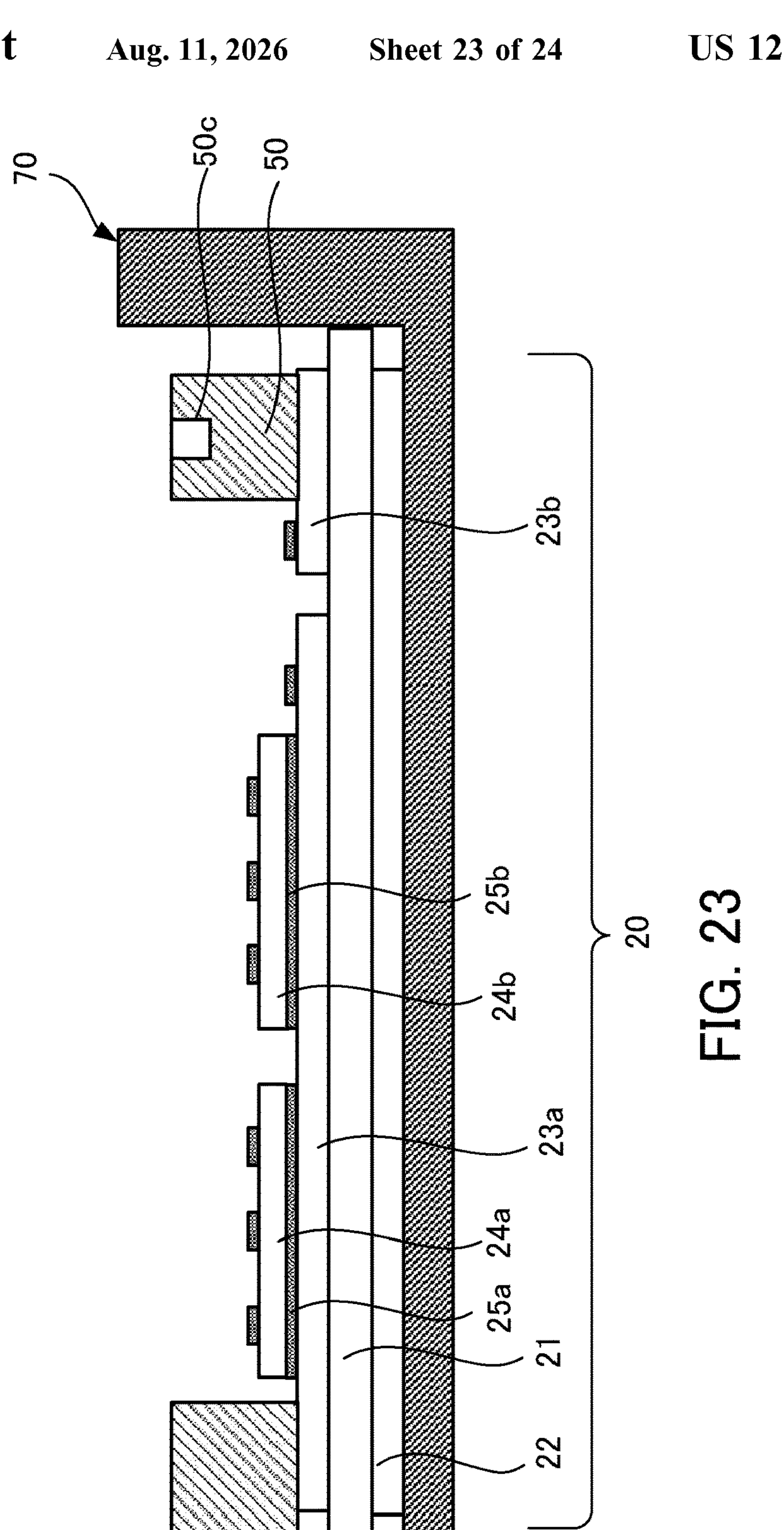
FIG. 23 is a first diagram depicting a mounting process included in a method of manufacturing a semiconductor device according to a third embodiment.
Figure 24:
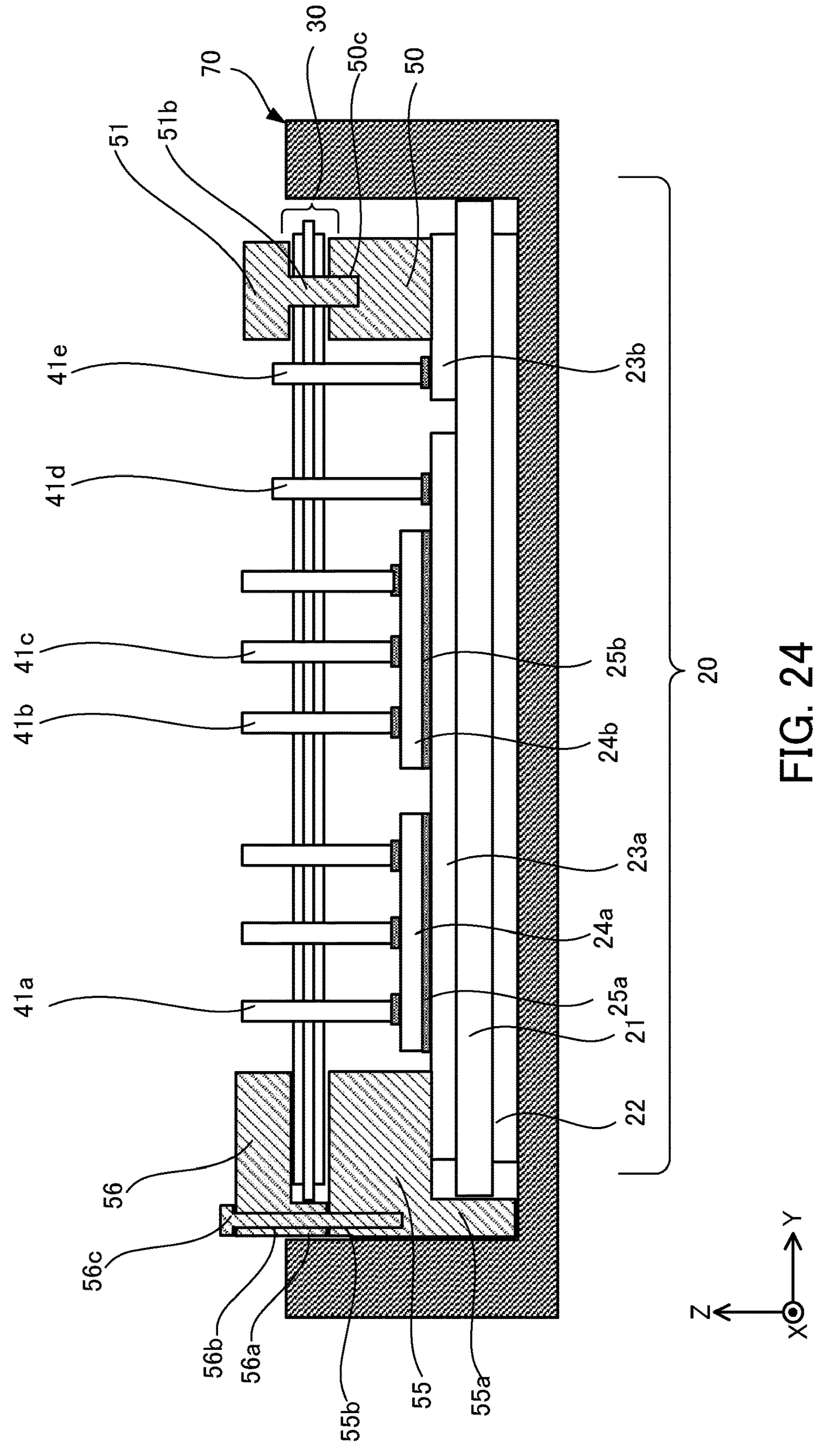
FIG. 24 is a second diagram depicting the mounting process included in the method of manufacturing a semiconductor device according to the third embodiment.

In the third embodiment, another method of manufacturing the semiconductor device 10*a* according to the second embodiment will be described with reference to FIGS. 23, 24, and 19. FIGS. 23 and 24 depict a mounting process included in the method of manufacturing the semiconductor device according to the third embodiment.

First, the processes in steps S1, S2*a*, and S2*b* in FIG. 19 are performed in the same way as in the second embodiment. Note that spacer portions (spacers) 55 and pressing portions 56, which are additionally prepared in step S1, will be described later.

In the insulated circuit board assembly process (step S2*a*), as depicted in FIG. 23, the insulated circuit board 20 is set in the mold 70 and the semiconductor chips 24*a* and 24*b* are disposed via plate solder (not illustrated) in predetermined regions of the circuit pattern 23*a* of the insulated circuit board 20. Note that the insulated circuit board 20 is set in the mold 70 with a gap provided on the left side in FIG. 23. Plate solder is disposed in the same way in regions of the circuit patterns 23*a* and 23*b* of the insulated circuit board 20 and the semiconductor chips 24*a* and 24*b* where the conductive posts 41*a* to 41*e* are to be bonded. In addition, the spacer portions 50 and 55 are disposed at the four corners of the insulated circuit board 20. The spacer portions 50 are disposed on the right side of the insulated circuit board 20 in FIG. 23 (at the front and behind relative to the plane of the drawing). Note that concave portions (concave members) 50*c* are formed on the upper surfaces of the spacer portions 50. The spacer portions 55 have convex portions (convex members) 55*a* that extend vertically downward (in the −Z direction) relative to rear surfaces of the spacer portions 55 formed at end portions of the rear surface. In addition, each spacer portion 55 has a concave portion 55*b* formed on the upper surface above the convex portion 55*a*. Accordingly, the spacer portions 55 are disposed on the left of the insulated circuit board 20 in FIG. 23 (at the front and behind relative to the plane of the drawing), with the convex portions 55*a* fitting between the insulated circuit board 20 and the mold 70.

Next, a mounting process (step S3) is performed to mount the printed circuit board 30 on the insulated circuit board 20 obtained in steps S2*a* and S2*b*. The printed circuit board 30 assembled in step S2*b* is mounted on the spacer portions 50 and 55 of the insulated circuit board 20 assembled in step S2*a*.

Next, an attachment process is performed to attach the pressing portions 51 and 56 to the front surface of the printed circuit board 30 (step S4). The pressing portions 51 are attached onto the spacer portions 50 on the right side in FIG. 24 with the printed circuit board 30 disposed in between. The convex portions 51*b* are formed on the lower surfaces of the pressing portions 51. When the pressing portions 51 are disposed on the printed circuit board 30, the convex portions 51*b* pass through the printed circuit board 30 and fit into the concave portions 50*c* of the spacer portions 50.

Also, the pressing portions 56 are attached onto the spacer portions 55 on the left side in FIG. 24 with the printed circuit board 30 disposed in between. The pressing portions 56 have convex portions 56*a* that extend vertically downward (in the −Z direction) relative to rear surfaces of the pressing portions 56 formed at end portions of the rear surface. The pressing portions 56 are formed with through-holes 56*b* that pass through from the upper surfaces to the lower surfaces of the convex portions 56*a*. These pressing portions 56 are attached to the left side in FIG. 24 of the printed circuit board 30 with the convex portions 56*a* fitting between the printed circuit board 30 and the mold 70. In addition, support rods 56*c* are passed through the through-holes 56*b* in the pressing portions 56 and are inserted into concave portions 55*b* in the spacer portions 55. By doing so, the printed circuit board 30 is interposed between the pressing portions 51 and 56 and the spacer portions 50 and 55. This means that movement of the printed circuit board 30 in the vertical direction (+Z direction) is restricted. In addition, movement of the printed circuit board 30 in directions on a plane (the X-Y plane) is restricted by the convex portions 56*a* of the pressing portions 56 as well as the support rods 56*c*, and the convex portions 51*b* of the pressing portions 51.

Next, a solder bonding process (step S5) is performed to add heat to melt the solder and then perform cooling to create soldered bonds. When doing so, even when warping of the printed circuit board 30 occurs due to the heating, the printed circuit board 30 is pressed toward the spacer portions 50 and 55 by the pressing portions 51 and 56. This means that the warping that has occurred for the printed circuit board 30 is corrected and the lower end portions of the conductive posts 41*a* to 41*e* are kept in contact with the insulated circuit board 20 and the semiconductor chips 24*a* and 24*b*. By cooling the melted solder, the conductive posts 41*a* to 41*e* are reliably bonded to the insulated circuit board 20 and the semiconductor chips 24*a* and 24*b*.

Next, a removing process (step S6*a*) is performed to remove the pressing portions 51 and 56 and the spacer portions 50 and 55 from the integrated printed circuit board 30, the insulated circuit board 20 and the semiconductor chips 24*a* and 24*b*. When removing the pressing portions 51 and 56 and the spacer portions 50 and 55, the printed circuit board 30 and the insulated circuit board 20 that have been integrated are removed from the mold 70. The support rods 56*c* are pulled out, the pressing portions 51 and 56 are pulled upward, and the spacer portions 50 and 55 are outwardly removed.

Next, an encapsulating process (step S6) is performed to encapsulate the printed circuit board 30, the insulated circuit board 20, and the semiconductor chips 24*a* and 24*b* that have been integrated with an encapsulating member. In step S6*a*, the pressing portions 51 and 56 and the spacer portions 50 and 55 are removed, and the printed circuit board 30, the insulated circuit board 20 and the semiconductor chips 24*a* and 24*b* that have been integrated are set in a predetermined mold, which is then filled with the encapsulating member. When the encapsulating member has solidified, the mold is released to obtain the semiconductor device 10*a* depicted in FIGS. 17 and 18.

In the semiconductor device 10*a* manufactured in this way, warping that occurs in the printed circuit board 30 during heating included in the manufacturing process may be corrected by the pressing portions 51 and 56. In addition, the pressing portions 51 and 56 are able to prevent the printed circuit board 30 from becoming displaced in directions on a plane. By doing so, since the printed circuit board 30 is kept substantially horizontal, the lower end portions of the conductive posts 41*a* to 41*e* do not become separated from the insulated circuit board 20 and the semiconductor chips 24*a* and 24*b*, do not become positionally displaced, and remain bonded to the insulated circuit board 20 and the semiconductor chips 24*a* and 24*b*. As a result, the mechanical and electrical connections of the conductive posts 41*a* to 41*e* are maintained, which suppress deterioration in the reliability of the semiconductor device 10*a*.

According to the present disclosure, it is possible to reliably connect conductive posts mechanically and electrically, which makes it possible to suppress deterioration in reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:

a semiconductor chip including an electrode on a main surface thereof;

an insulated circuit board including an insulating board and a circuit pattern formed on a front surface of the insulating board, the circuit pattern having the semiconductor chip on a front surface thereof;

a plurality of conductive posts, each conductive post having a lower end and an upper end opposite to each other, the lower end being bonded to at least one of the front surface of the circuit pattern or the electrode of the semiconductor chip, each conductive post extending vertically upward from a front surface of the insulated circuit board;

a printed circuit board bonded to the upper ends of each of the plurality of conductive posts;

a spacer disposed between the printed circuit board and the insulated circuit board, the spacer having an upper end contacting a back surface of the printed circuit board and a lower end contacting the insulated circuit board; and a pressing member disposed above the spacer with the printed circuit board interposed between the pressing member and the spacer, the pressing member having a lower end contacting a front surface of the printed circuit board.

2. The semiconductor device according to claim 1, further comprising a support rod that penetrates through the printed circuit board and the spacer, and is bonded to a front surface of the circuit pattern.

3. The semiconductor device according to claim 2, wherein the support rod further penetrates through the pressing member.

4. The semiconductor device according to claim 2, wherein the pressing member is integrally formed on the support rod.

5. The semiconductor device according to claim 1, wherein the insulated circuit board has four corners in a plan view of the device, and the spacer is provided as four spacers that are respectively disposed at the four corners of the insulated circuit board.

6. The semiconductor device according to claim 5, wherein the pressing member is provided along a side of the insulated circuit board in the plan view.

7. The semiconductor device according to claim 6, wherein the pressing member is provided on each of a pair of sides of the insulated circuit board that face each other in the plan view.

8. The semiconductor device according to claim 7, wherein the pressing member is provided along all sides of the insulated circuit board in the plan view so as to surround an entire circumference of the insulated circuit board.

9. The semiconductor device according to claim 1, wherein an upper surface of the spacer faces a lower surface of the pressing member, the upper surface of the spacer has one of a convex member or a concave member, the lower surface of the pressing member has the other of the convex member or the concave member, and the convex member penetrates through the printed circuit board and fits into the concave member.

10. A method of manufacturing a semiconductor device, the method comprising:

preparing a semiconductor chip provided with an electrode on a main surface, an insulated circuit board including an insulating board and a circuit pattern formed on a front surface of the insulating board, a plurality of conductive posts, and a printed circuit board;

placing the printed circuit board above the insulated circuit board via a spacer, the spacer having a lower end contacting the insulated circuit board and an upper end contacting a back surface of the printed circuit board, bonding the plurality of conductive posts to the printed circuit board, and disposing lower end portions of the plurality of conductive posts via solder on at least one of a front surface of the circuit pattern or the electrode of the semiconductor chip;

attaching a pressing member to the spacer with the printed circuit board between the pressing member and the spacer, the pressing member having a lower end contacting a front surface of the printed circuit board; and bonding the plurality of conductive posts to the circuit pattern by adding heat.

11. The method according to claim 10, wherein a convex member that penetrates through the printed circuit board and a concave member into which the convex member fits are respectively formed on different ones of an upper surface of the spacer and a lower surface of the pressing member that faces the upper surface of the spacer, the disposing the plurality of conductive posts includes, after bonding the plurality of conductive posts to the printed circuit board, disposing the printed circuit board so as to face the insulated circuit board via the spacer, including inserting the convex member through the printed circuit board, and the attaching of the pressing member includes attaching the pressing member by fitting the convex member into the concave member.

12. The method according to claim 10, further comprising removing the spacer and the pressing member, after the bonding the plurality of conductive posts to the circuit pattern.

13. The method according to claim 10, wherein preparing the printed circuit board includes providing a printed circuit board including a single planar insulating substrate, and placing the printed circuit board above the insulated circuit board includes disposing the spacer along a periphery of the insulating substrate, such that the insulating substrate of the printed circuit board overlaps the insulated circuit board in a plan view of the semiconductor device.

14. The semiconductor device according to claim 1, wherein the printed circuit board includes a single planar insulating substrate, and the spacer is disposed along a periphery of the insulating substrate, such that the insulating substrate of the printed circuit board overlaps the insulated circuit board in a plan view of the semiconductor device.

15. A semiconductor device, comprising:

a semiconductor chip including an electrode on a main surface thereof;

an insulated circuit board including an insulating board and a circuit pattern formed on a front surface of the insulating board, the circuit pattern having the semiconductor chip on a front surface thereof;

a plurality of conductive posts, each conductive post having a lower end and an upper end opposite to each other, the lower end being bonded to at least one of the front surface of the circuit pattern or the electrode of the semiconductor chip, each conductive post extending vertically upward from a front surface of the insulated circuit board;

a printed circuit board including a single planar insulating substrate and being bonded to the upper end of each of the plurality of conductive posts;

a spacer disposed between the printed circuit board and the insulated circuit board, around a periphery of the insulating substrate, such that the insulating substrate of the printed circuit board overlaps the insulated circuit board in a plan view of the semiconductor device; and a pressing member disposed above the spacer with the printed circuit board interposed between the pressing member and the spacer.

* * * * *